(12) United States Patent
Lin et al.

(10) Patent No.: US 11,723,209 B2
(45) Date of Patent: Aug. 8, 2023

(54) THREE-DIMENSIONAL MEMORY DEVICE AND MANUFACTURING METHOD THEREOF

(71) Applicant: Taiwan Semiconductor Manufacturing Company, Ltd., Hsinchu (TW)

(72) Inventors: Meng-Han Lin, Hsinchu (TW); Chun-Fu Cheng, Hsinchu County (TW); Feng-Cheng Yang, Hsinchu County (TW); Sheng-Chen Wang, Hsinchu (TW); Yu-Chien Chiu, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 132 days.

(21) Appl. No.: 17/159,120

(22) Filed: Jan. 26, 2021

(65) Prior Publication Data
US 2021/0375938 A1 Dec. 2, 2021

Related U.S. Application Data

(60) Provisional application No. 63/031,577, filed on May 29, 2020.

(51) Int. Cl.
*H10B 51/20* (2023.01)
*H10B 43/27* (2023.01)
*H10B 51/30* (2023.01)

(52) U.S. Cl.
CPC ............. *H10B 51/20* (2023.02); *H10B 43/27* (2023.02); *H10B 51/30* (2023.02)

(58) Field of Classification Search
CPC ......... H01L 27/11578; H01L 27/11582; H01L 27/1159; H01L 27/11597; H01L 29/78391;
(Continued)

(56) References Cited

U.S. PATENT DOCUMENTS 9,209,247 B2   12/2015   Colinge et al.
9,236,267 B2   1/2016    De et al.
(Continued)

*Primary Examiner* — Meiya Li
(74) *Attorney, Agent, or Firm* — JCIPRNET

(57) ABSTRACT

A three-dimensional memory device and a manufacturing method thereof are provided. The three-dimensional memory device includes first and second stacking structures, isolation pillars, gate dielectric layers, channel layers and conductive pillars. The stacking structures are laterally spaced apart from each other. The stacking structures respectively comprises alternately stacked insulating layers and conductive layers. The isolation pillars laterally extend between the stacking structures. The isolation pillars further protrude into the stacking structures, and a space between the stacking structures is divided into cell regions. The gate dielectric layers are respectively formed in one of the cell regions, and cover opposing sidewalls of the stacking structures and sidewalls of the isolation pillars. The channel layers respectively cover an inner surface of one of the gate dielectric layers. The conductive pillars are separately located within the cell regions, and are laterally surrounded by the channel layers.

20 Claims, 31 Drawing Sheets

(58) Field of Classification Search
CPC ....... H01L 29/792; H10B 43/20; H10B 43/27; H10B 51/30
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2009/0283819 A1* | 11/2009 | Ishikawa ............... H01L 29/792 257/E21.21 |
| 2020/0185411 A1* | 6/2020 | Herner ............... H01L 27/11578 |
| 2021/0175253 A1* | 6/2021 | Han ................... H01L 29/78642 |

* cited by examiner

THREE-DIMENSIONAL MEMORY DEVICE AND MANUFACTURING METHOD THEREOF

CROSS-REFERENCE TO RELATED APPLICATION

This application claims the priority benefit of U.S. provisional application Ser. No. 63/031,577, filed on May 29, 2020. The entirety of the above-mentioned patent application is hereby incorporated by reference herein and made a part of this specification.

BACKGROUND

In the past decades, growing demand for data storage has led to continuously scaling of non-volatile memory, and to development of cells in the non-volatile memory from single-level cells (SLCs) to multi-level cells (MLCs). However, these solutions are limited by the confines of two-dimensional design. All of the cells in the non-volatile memory are lined up next to each other in a string, but there is only one level of cells. This ultimately limits the capacity that the non-volatile memory could offer.

Three-dimensional memory is a new evolution that solves some of the problems with storage capacity of the non-volatile memory. By stacking cells vertically, it is possible to dramatically increase the storage capacity without significantly increasing footprint area of the non-volatile memory. Nevertheless, issues including, for example, interference between cells may come along with the evolution from two-dimensional design to three-dimensional design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 9A are schematic three-dimensional views illustrating structures at various stages during the manufacturing process of the three-dimensional memory device as shown in FIG. 1.

FIG. 2B through FIG. 9B are schematic cross-sectional views along the lines A-A' shown in FIG. 2A through FIG. 9A, respectively.

FIG. 4C through FIG. 9C are enlarged plan views illustrating isolation pillars and related components at process steps described with reference to FIG. 4A through FIG. 9A, respectively.

DETAILED DESCRIPTION

Figure 1:
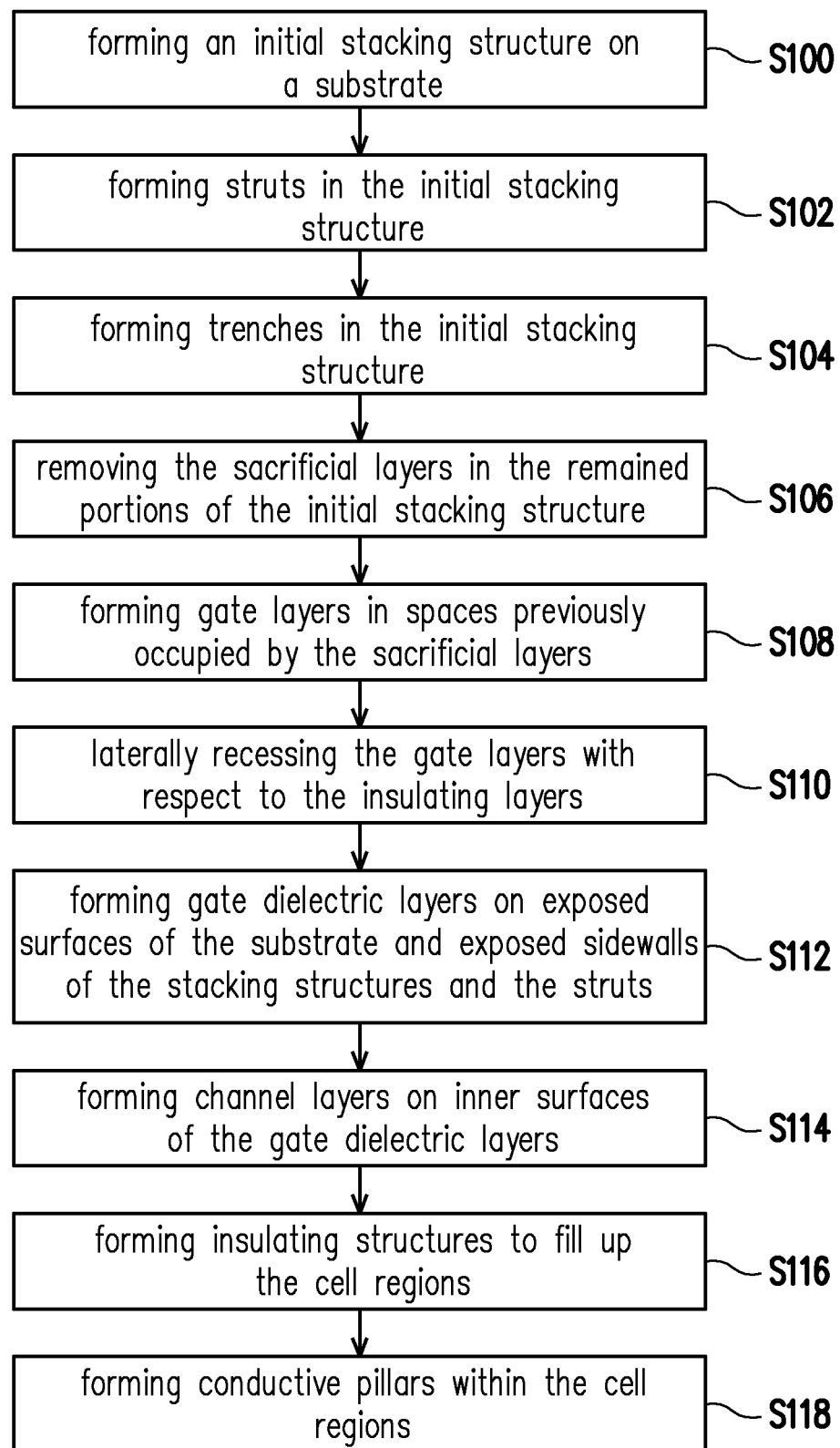
FIG. 1 is a flow diagram illustrating a manufacturing method for forming a three-dimensional memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a flow diagram illustrating a manufacturing method for forming a three-dimensional memory device 10 according to some embodiments of the present disclosure. FIG. 2A through FIG. 9A are schematic three-dimensional views illustrating structures at various stages during the manufacturing process of the three-dimensional memory device 10 as shown in FIG. 1. FIG. 2B through FIG. 9B are schematic cross-sectional views along the lines A-A' shown in FIG. 2A through FIG. 9A, respectively. FIG. 4C through FIG. 9C are schematic plan views illustrating isolation pillars 108 and related components at process steps described with reference to FIG. 2A through FIG. 9A, respectively.

Figure 2A:
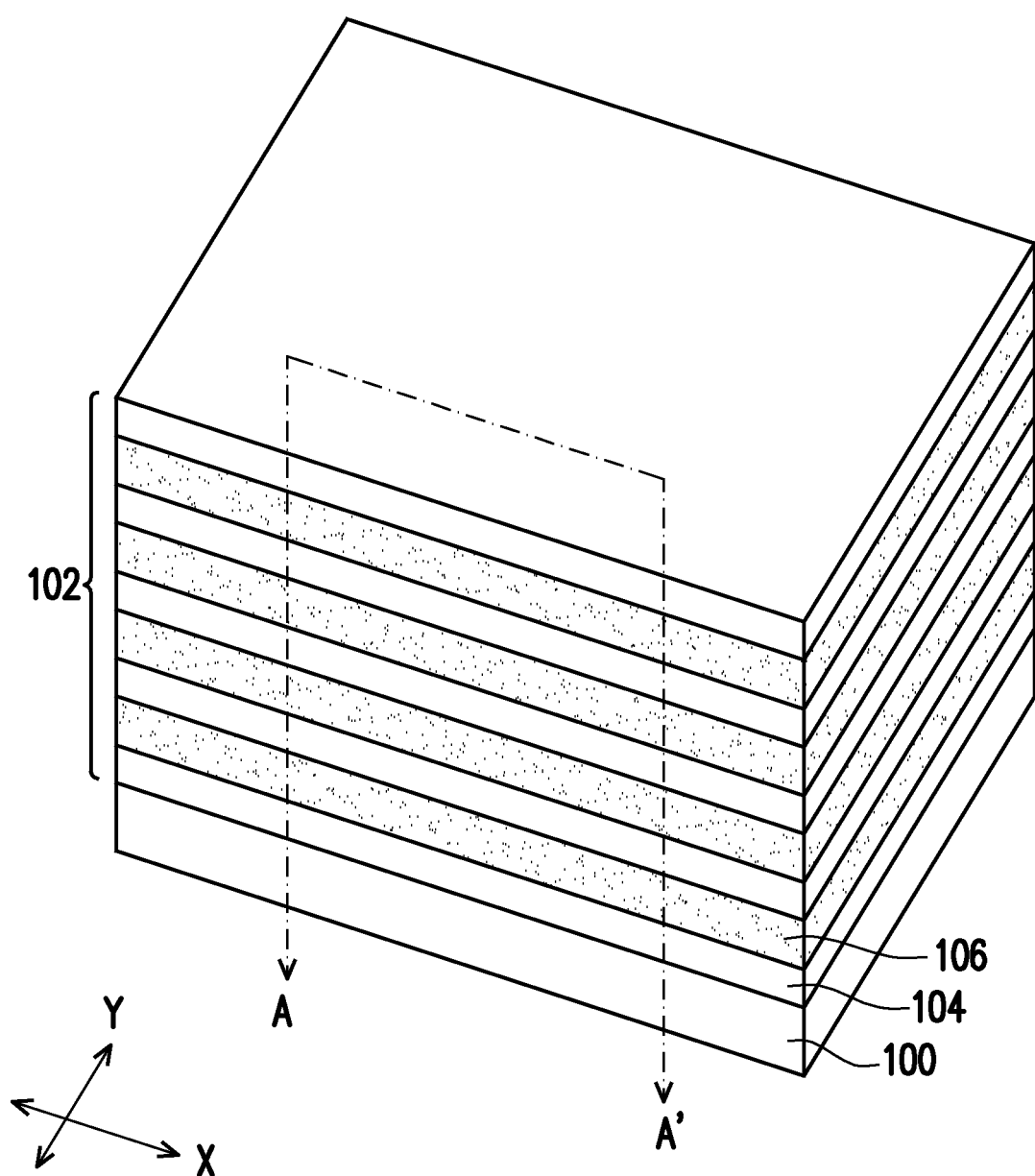
Figure 2B:
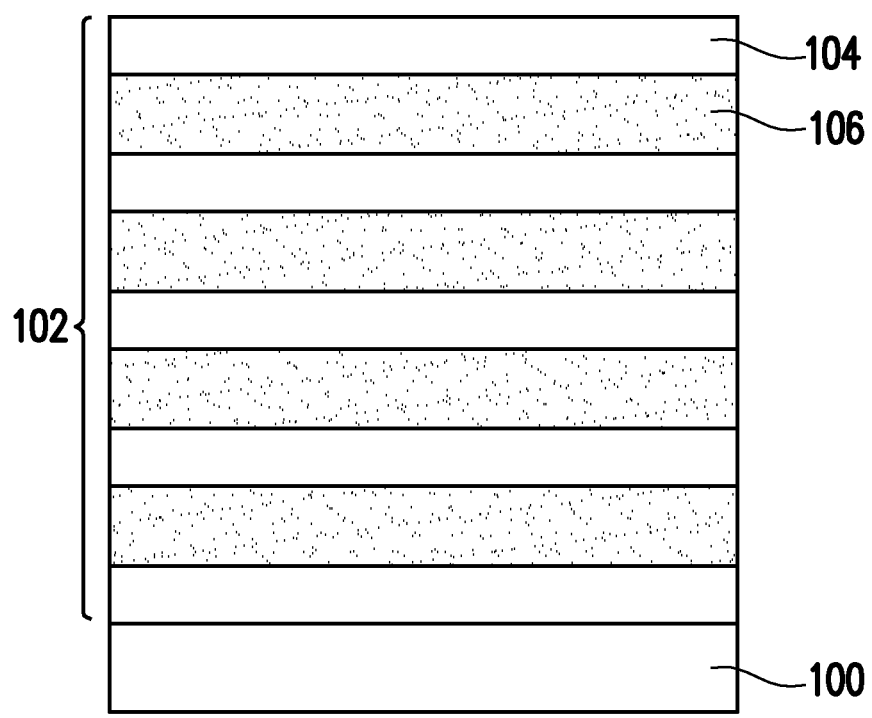

Referring to FIG. 1, FIG. 2A and FIG. 2B, step S100 is performed, and an initial stacking structure 102 is formed on a substrate 100. The initial stacking structure 102 includes insulating layers 104 and sacrificial layers 106, and the insulating layers 104 and the sacrificial layers 106 are alternately stacked on the substrate 100. Each sacrificial layer 106 may be sandwiched between an underlying insulating layer 104 and an overlying insulating layer 104. Further, the sacrificial layers 106 will be replaced by conductive layers 110 in the subsequent steps to be described with reference to FIG. 5A-5C and FIG. 6A-6C, and the insulating layers 104 space apart the sacrificial layers 106 from one another. Although five of the insulating layers 104 and four of the sacrificial layers 106 are depicted in FIG. 2A, those skilled in the art may adjust an amount of the insulating layers 104 and the sacrificial layers 106 according to design requirements, the present disclosure is not limited. A material of the insulating layers 104 has a sufficient etching selectivity with respect to a material of the sacrificial layers 106, such that the insulating layers 104 could remain substantially intact during removal of the sacrificial layers 106 in the subsequent step as to be described with reference to FIG. 5A-5C. In some embodiments, the insulating layers 104 are made of silicon oxide, while the sacrificial layers 106 are made of silicon nitride. However, those skilled in the art may select other suitable materials for the insulating layers 104 and the sacrificial layers 106 according to process requirements, the present disclosure is not limited thereto. Moreover, in some embodiments, a method for forming the each of the insulating layers 104 and the sacrificial layers 106 includes a deposition process, such as a chemical vapor deposition (CVD) process. On the other hand, in some embodiments, the substrate 100 is an etching stop layer formed over a complementary metal-oxide-semiconductor (CMOS) integrated circuit. In these embodiments, a material of the substrate 100 has a sufficient etching selectivity with respect to the materials in the initial stacking structure 102. In those embodiments where the insulating layers 104 and the sacrificial layers 106 are made of silicon oxide and silicon nitride, the material of the substrate 100 may include silicon carbide, silicon oxycarbide (SiOC), silicon oxycarbonitride (SiOCN), silicon carbonitride (SiCN), the like or combinations thereof. In alternative embodiments, the substrate 100 is a semiconductor wafer or a semiconductor-on-insulator (SOI) wafer.

Figure 3A:
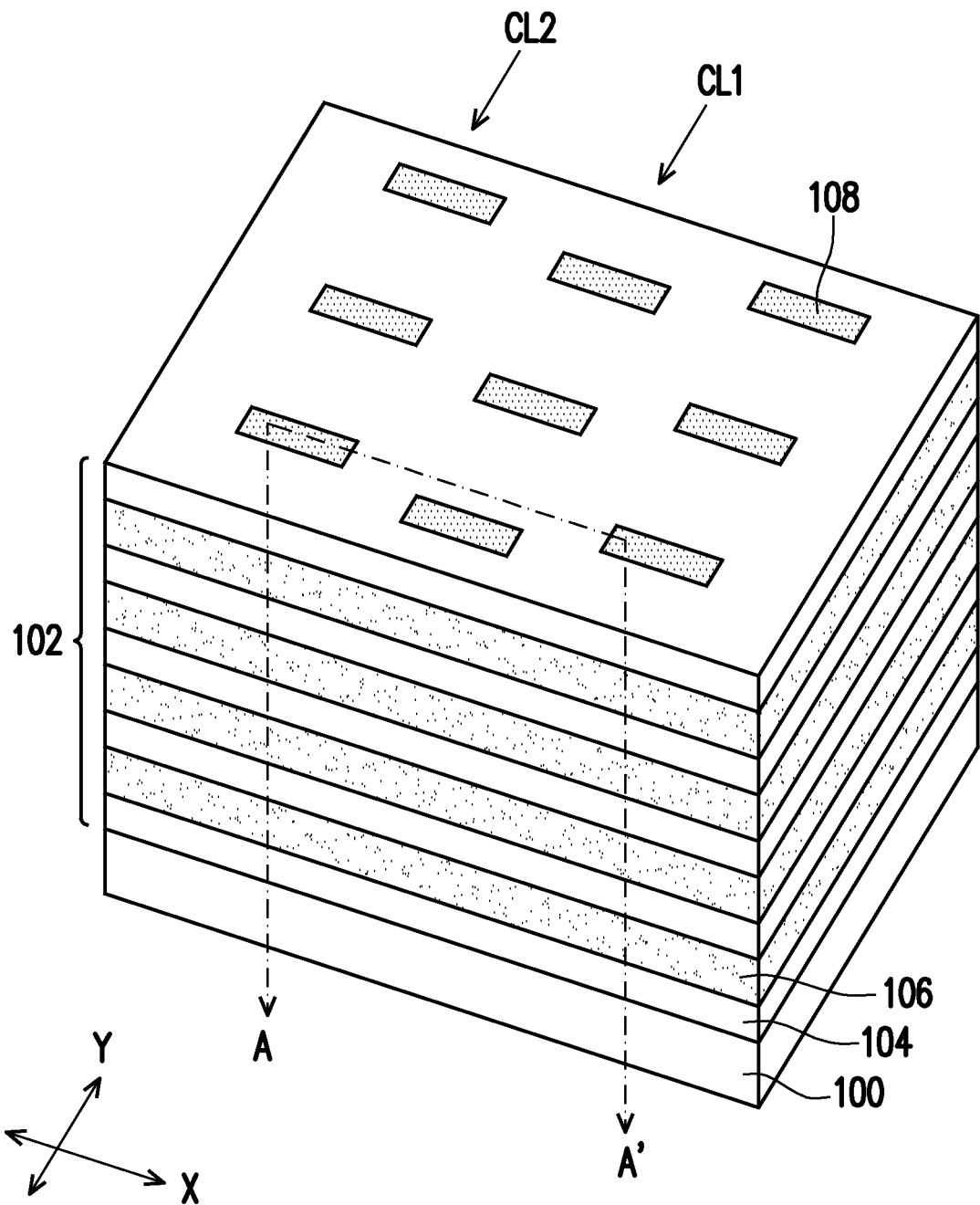
Figure 3B:
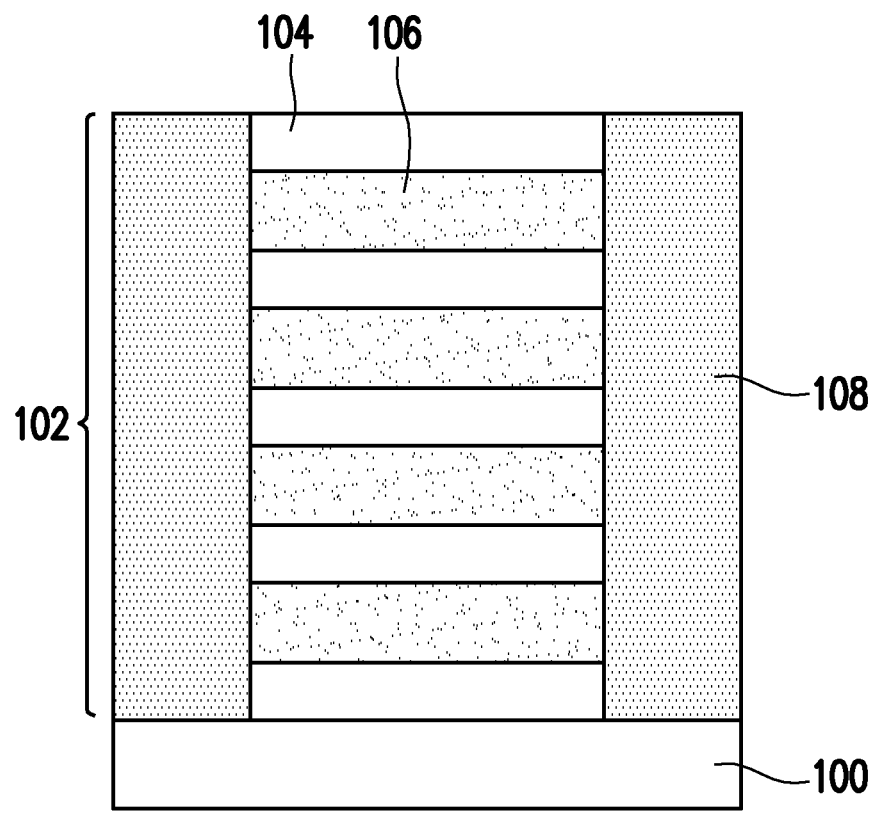

Referring to FIG. 1, FIG. 3A and FIG. 3B, step S102 is performed, and isolation pillars 108 are formed in the initial stacking structure 102. The isolation pillars 108 penetrate through the initial stacking structure 102 along a stacking direction of the insulating layers 104 and the sacrificial layers 106, and may reach to the substrate 100. In addition, the isolation pillars 108 are separately arranged as having multiple columns extending along a direction Y, and adjacent columns of the isolation pillars 108 are spaced apart from each other along a direction X intersected with the direction Y. In some embodiments, the columns of the isolation pillars 108 are alternately offset from others along the same direction (e.g., the direction Y) by substantially identical offset amount. For instance, even columns CL1 of the isolation pillars 108 are offset from odd columns CL2 of the isolation pillars 108 along the direction Y. In these embodiments, the isolation pillars 108 are arranged in a staggered configuration. Each of the isolation pillars 108 may be a vertical sheet that has a top view shape with a long axis perpendicular to the column direction of the isolation pillars 108 (e.g., the direction Y). For instance, each isolation pillar 108 may be formed as having a substantially rectangular or elliptical top view shape. The isolation pillars 108 are made of an insulating material. In some embodiments, the material of the isolation pillars 108 has a sufficient etching selectivity with respect to the materials of the insulating layers 104 and the sacrificial layers 106, such that the isolation pillars 108 may remain substantially intact during a subsequent step for forming trenches TR in the initial stacking structure 102 as to be described with reference to FIG. 4A-4C. In those embodiments where the insulating layers 104 and the sacrificial layers 106 are made of silicon oxide and silicon nitride, the material of the isolation pillars 108 may include aluminum oxide, hafnium oxide, tantalum oxide, zirconium oxide, nickel oxide, the like or combinations thereof. In addition, in some embodiments, a method for forming the isolation pillars 108 includes forming through holes in the initial stacking structure 102 by a lithography process and an etching process (e.g., an anisotropic etching process), and filling an insulating material into these through holes by a deposition process (e.g., a CVD process). Subsequently, a planarization process may be performed to remove portions of the insulating material above the initial stacking structure 102, and the remained portions of the insulating material form the isolation pillars 108. For instance, the planarization process may include a chemical mechanical polishing (CMP) process, an etching process or a combination thereof.

Figure 4A:
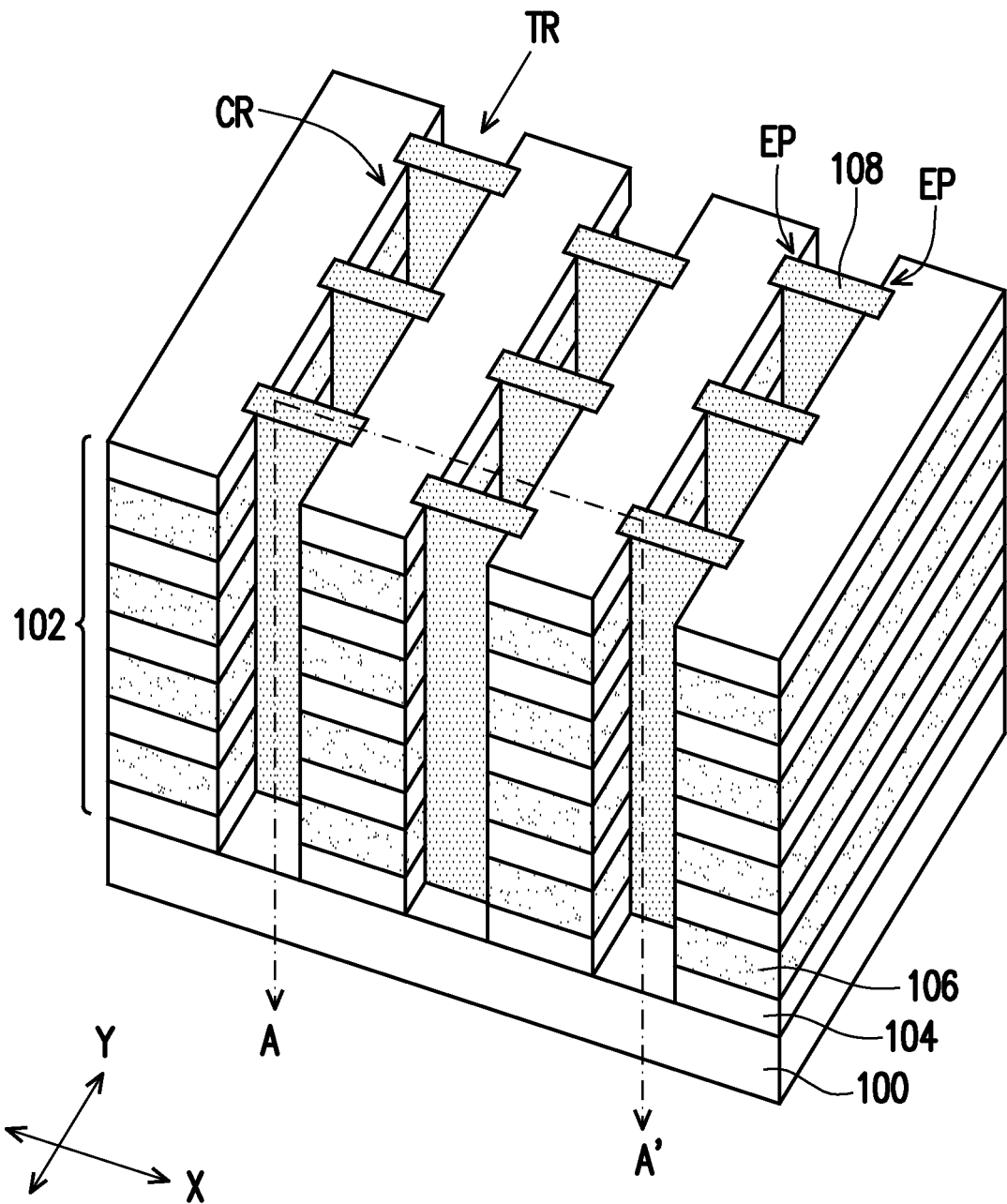
Figure 4B:
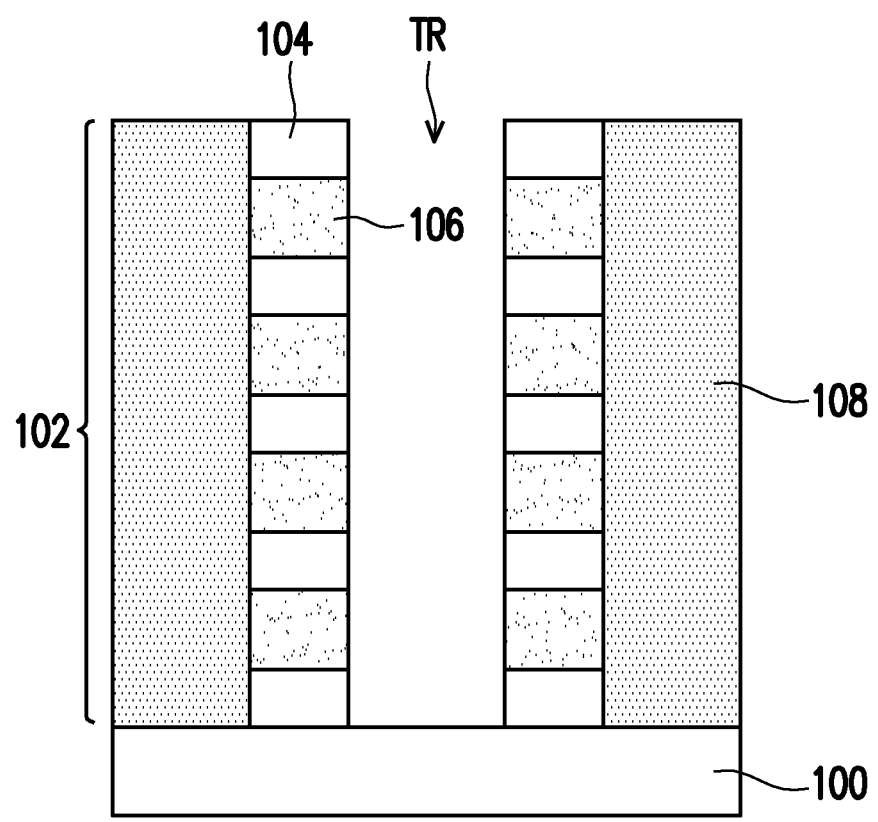
Figure 4C:
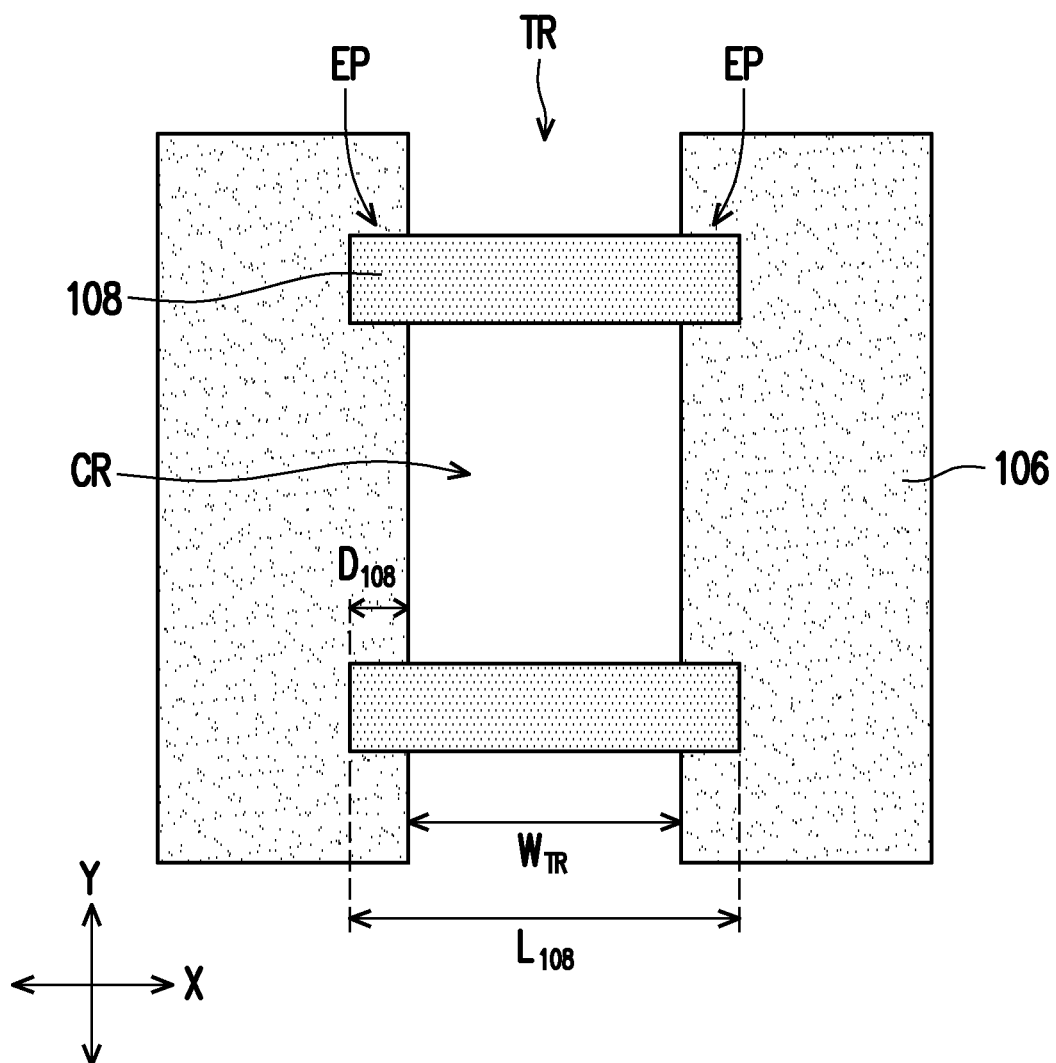

Referring to FIG. 1, FIG. 4A-4C, step S104 is performed, and trenches TR are formed in the initial stacking structure 102. The trenches TR penetrate through the initial stacking structure 102, and respectively extend along one of the columns of the isolation pillars 108. Accordingly, the isolation pillars 108 are exposed in the trenches TR, and the initial stacking structure 102 are cut into multiple linear portions by the trenches TR. In addition, a column of the isolation pillars 108 are intersected with one of the trenches TR, and each trench TR can be regarded as being divided into multiple sections by a column of the isolation pillars 108. Each section of the trench TR defined between adjacent isolation pillars 108 can be referred as a cell region CR, in which an active region of a pair of cells will be formed. Furthermore, the isolation pillars 108 laterally protrude into the remained portions of the initial stacking structure 102. As a result, end portions EP of the isolation pillars 108 are embedded in the remained portions of the initial stacking structure 102, whereas other portions of the end portions EP are exposed in the trenches TR. In other words, more than one sides of each end portion EP of the isolation pillars 108 may be in lateral contact with one of the remained portions of the initial stacking structure 102. For instance, as shown in FIG. 4A and FIG. 4C, three sides of each end portion EP of each isolation pillar 108 are in lateral contact with one of the remained portions of the initial stacking structure 102. In addition, a length $L_{108}$ of each isolation pillar 108 along the direction X is greater than a width $W_{TR}$ of each trench TR along the same direction (i.e., the direction X). In some embodiments, the isolation pillars 108 laterally protrude into the remained portions of the initial stacking structure 102 by a distance $D_{108}$ ranging from 1 nm to 20 nm. As will be described, by protruding the end portions of the isolation pillar 108 into the remained portions of the initial stacking structure 102, interference between adjacent cells can be effectively reduced. Those skilled in the art may adjust the dimensions of the trenches TR and the isolation pillars 108 to modify the distance $D_{108}$ according to process and design requirements, the present disclosure is not limited thereto. Furthermore, in those embodiments where the columns of the isolation pillars 108 are alternately offset from others, columns of the cell regions CR defined by the isolation pillars 108 are alternately offset from other columns of the cell regions CR. For instance, as shown in FIG. 4A, even columns of the cell regions CR are offset from odd columns of the cell regions CR along the direction Y. In some embodiments, a method for forming the trenches TR includes a lithography process and an etching process (e.g., an anisotropic etching process). Since the substrate 100 and the isolation pillars 108 may have sufficient etching selectivity with respect to the materials in the initial stacking structure 102, the substrate 100 and the isolation pillars 108 may remain substantially intact during the etching process.

Figure 5A:
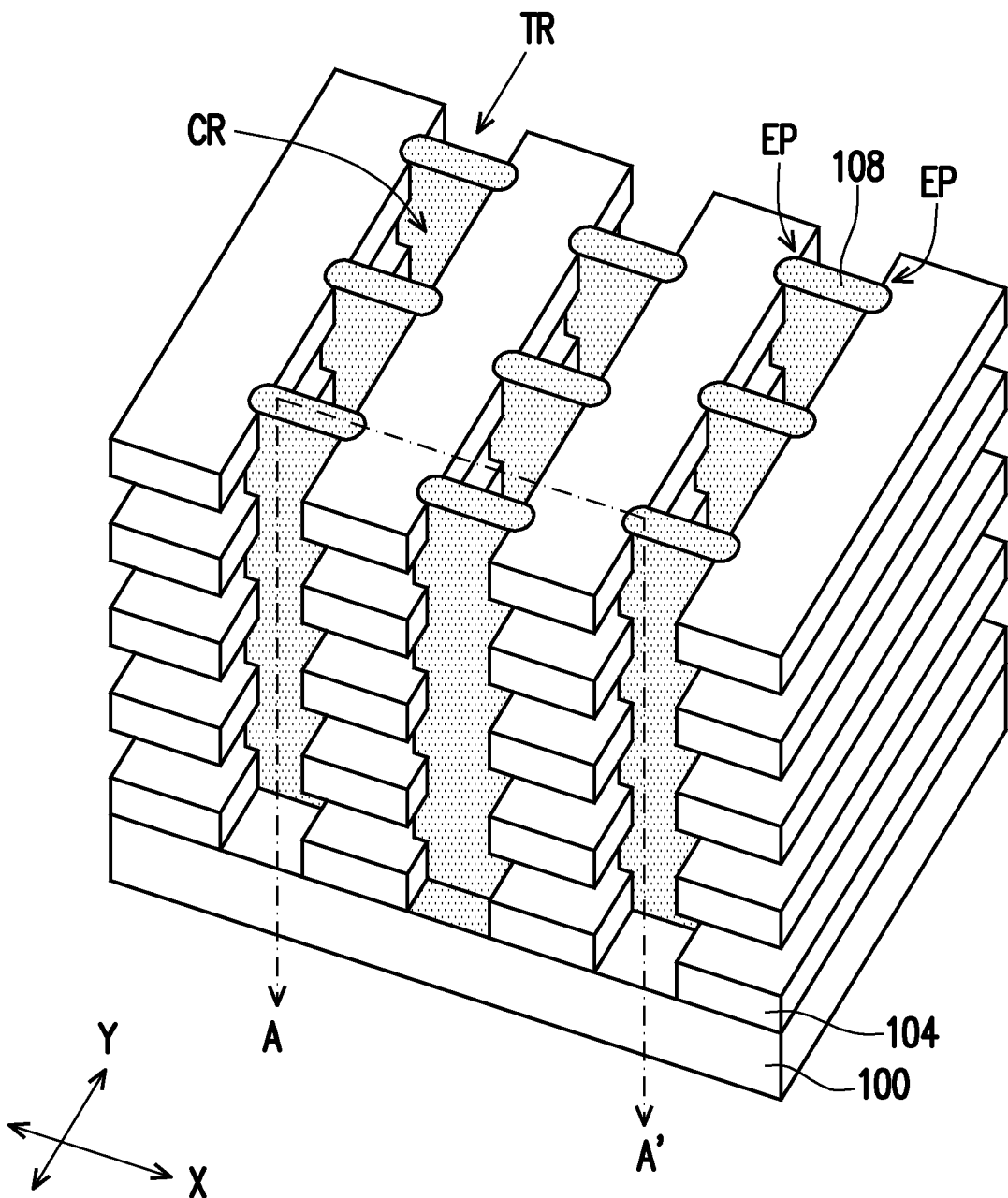
Figure 5B:
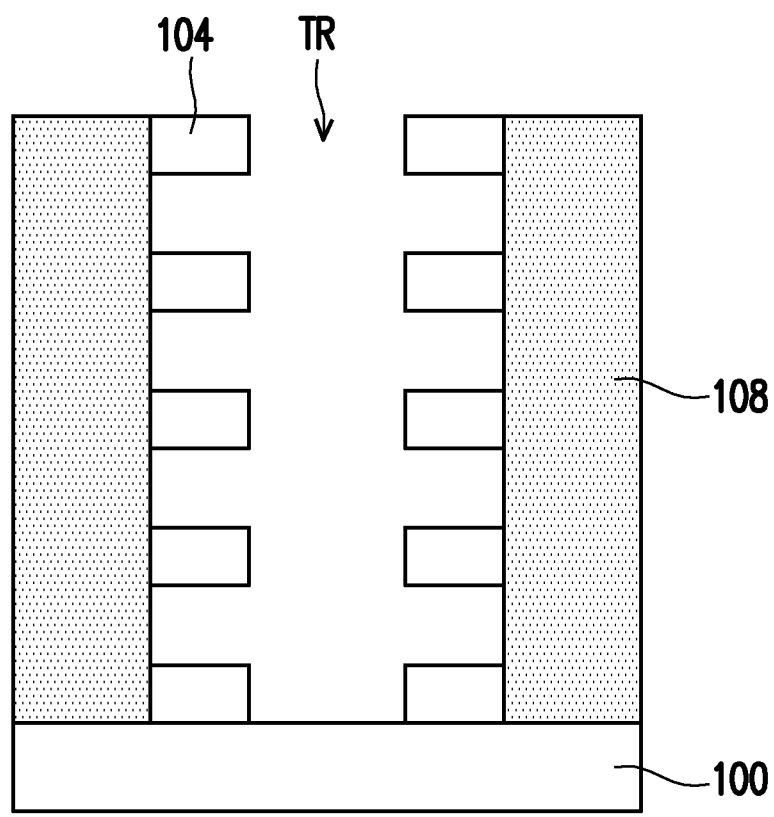
Figure 5C:
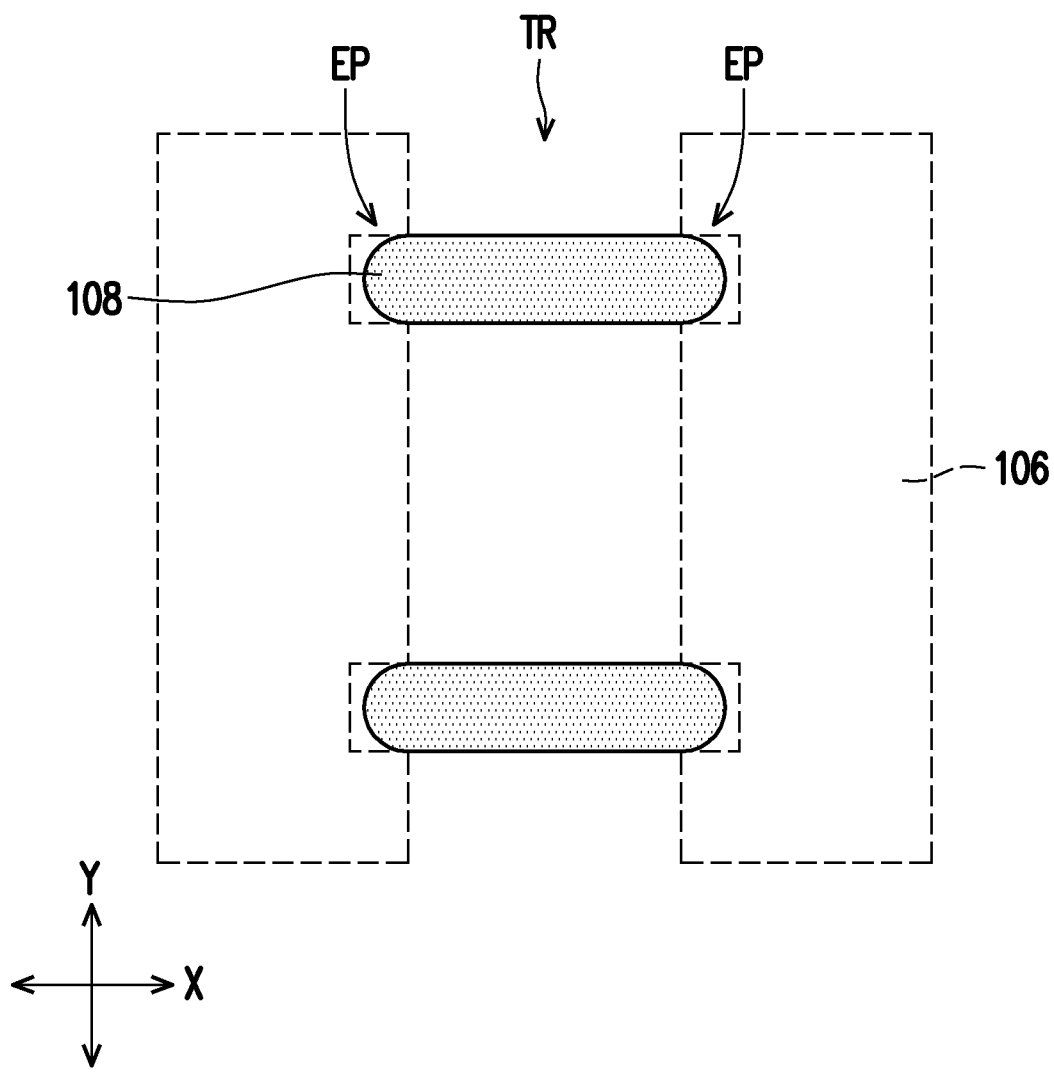

Referring to FIG. 1, FIG. 5A-5C, step S106 is performed, and the sacrificial layers 106 are selectively removed. By removing the sacrificial layers 106, surfaces of the insulating layers 104 and the isolation pillars 108 previously in contact with the sacrificial layers 106 are currently exposed. In addition, since the isolation pillars 108 are connected to the insulating layers 104, the isolation pillars 108 can provide support for the insulating layers 104, and prevent the insulating layers 104 from collapse after removal of the sacrificial layers 106. In some embodiments, the end portions EP of the isolation pillars 108 may be slightly consumed during removal of the sacrificial layers 106, but still embedded in the insulating layers 104. As shown in FIG. 5C, edges of the end portions EP of each isolation pillar 108 are laterally recessed from an original boundary of the end portions EP (indicated by dash lines) during removal of the sacrificial layers 106, but remain protruded from sidewalls of the trenches TR. In some embodiments, a method for removing the sacrificial layers 106 includes an isotropic etching process. Since the substrate 100, the insulating layers 104 and the isolation pillars 108 may have sufficient etching selectivity with respect to the sacrificial layers 106, the sacrificial layers 106 can be selectively removed during such isotropic etching process.

Referring to FIG. 1, FIG. 6A-6C, step S108 is performed, and conductive layers 110 are formed in spaces previously occupied by the sacrificial layers 106. In other words, the previously existed sacrificial layers 106 are currently replaced by the conductive layers 110. The insulating layers 104 and the conductive layers 110 are currently stacked on the substrate 100, and form stacking structures 112. The stacking structures 112 are laterally spaced apart from one another by the trenches TR, and are connected with one another by the isolation pillars 108. The isolation pillars 108 extend across the trenches TR and further protrude into the stacking structures 112 (shown in FIG. 6A and FIG. 6C). Accordingly, a length of the isolation pillars 108 along the direction X is greater than a spacing between adjacent stacking structures 112 along the direction X, which is also a length of the cell region CR along the direction X. In some embodiments, sidewalls of the conductive layers 110 are substantially coplanar with sidewalls of the insulating layers 104 in the current step. The conductive layers 110 are formed of a conductive material. For instance, the conductive material may include tungsten, titanium nitride, ruthenium, tantalum nitride, molybdenum, tungsten nitride, the like or combinations thereof. In some embodiments, a method for forming the conductive layers 110 includes filling up the trenches TR and spaces between the insulating layers 104 (shown in FIG. 5A) with the conductive material by a deposition process, such as a CVD process or an atomic layer deposition (ALD) process. Thereafter, portions of the conductive material not covered by the insulating layers 104 are removed by an etching process, such as an anisotropic etching process. The remained portions of the conductive material form the conductive layers 110. In other words, the insulating layers 104 may be functioned as shadow masks during such etching process, and such patterning of the conductive material can be considered as a self-aligning process. In addition, the isolation pillars 108 may be barely etched during such etching process as having sufficient etching selectivity with respect to the conductive material.

Figure 6A:
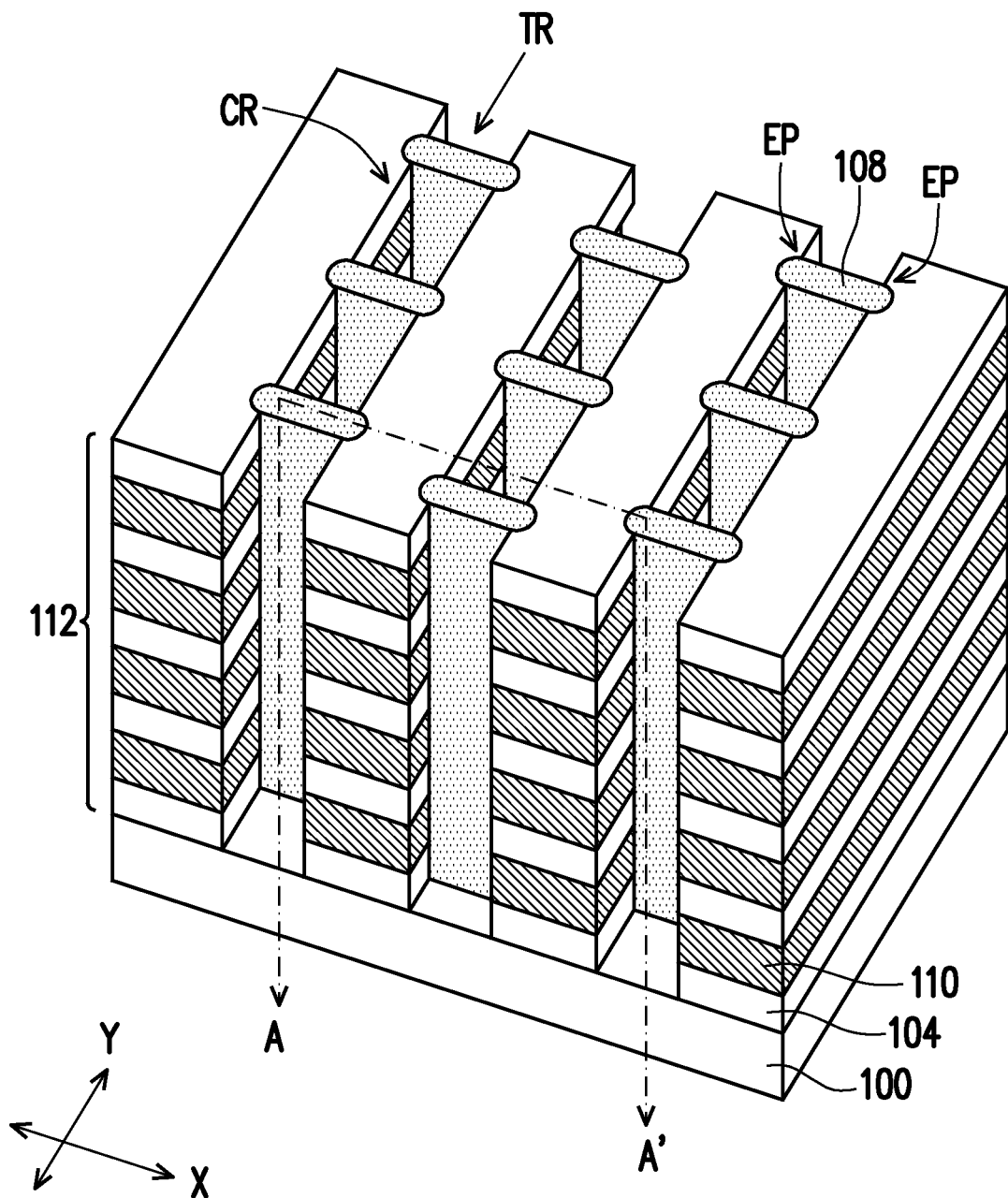
Figure 6B:
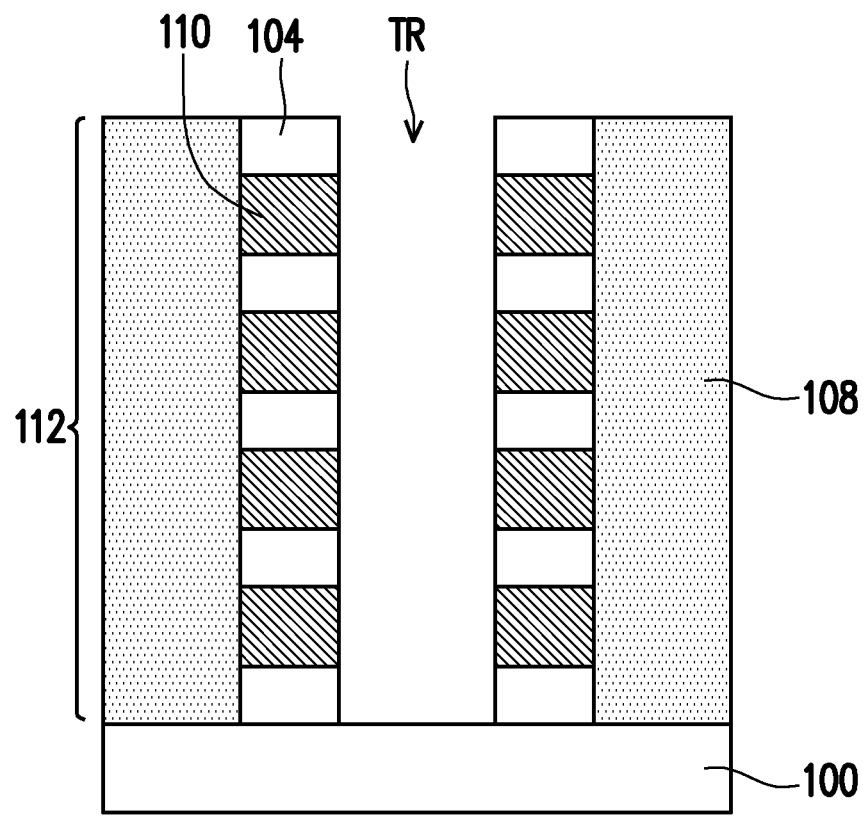
Figure 6C:
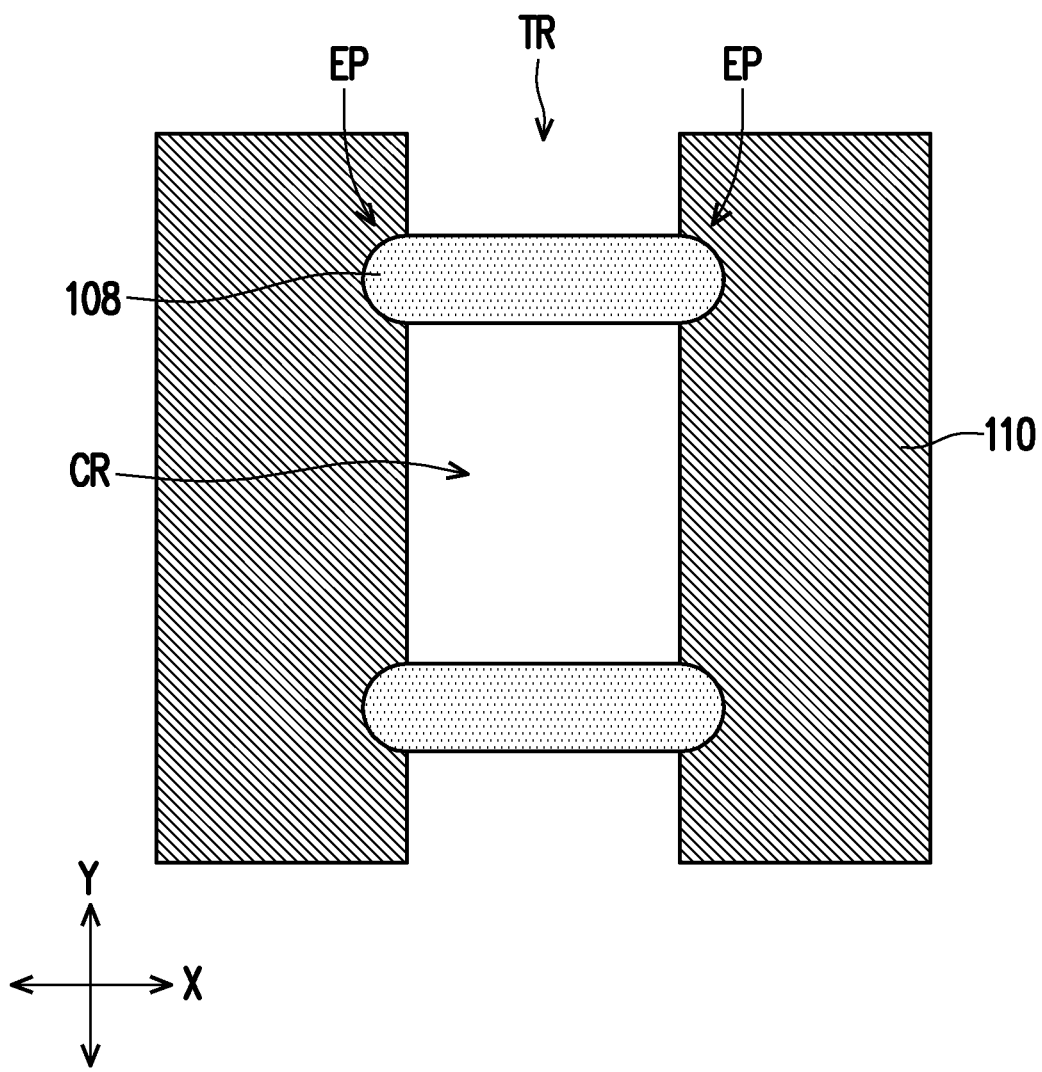
Figure 7A:
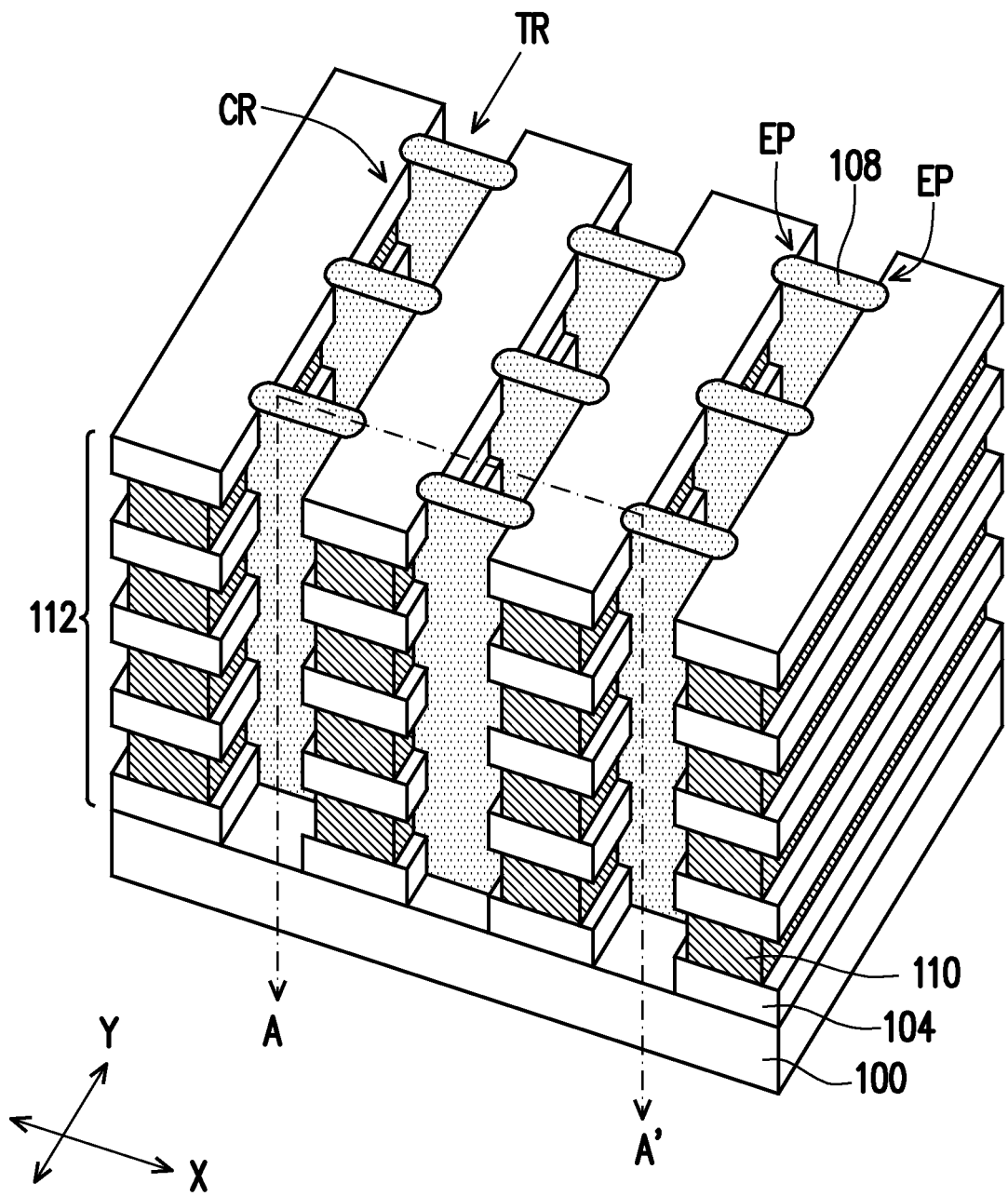
Figure 7B:
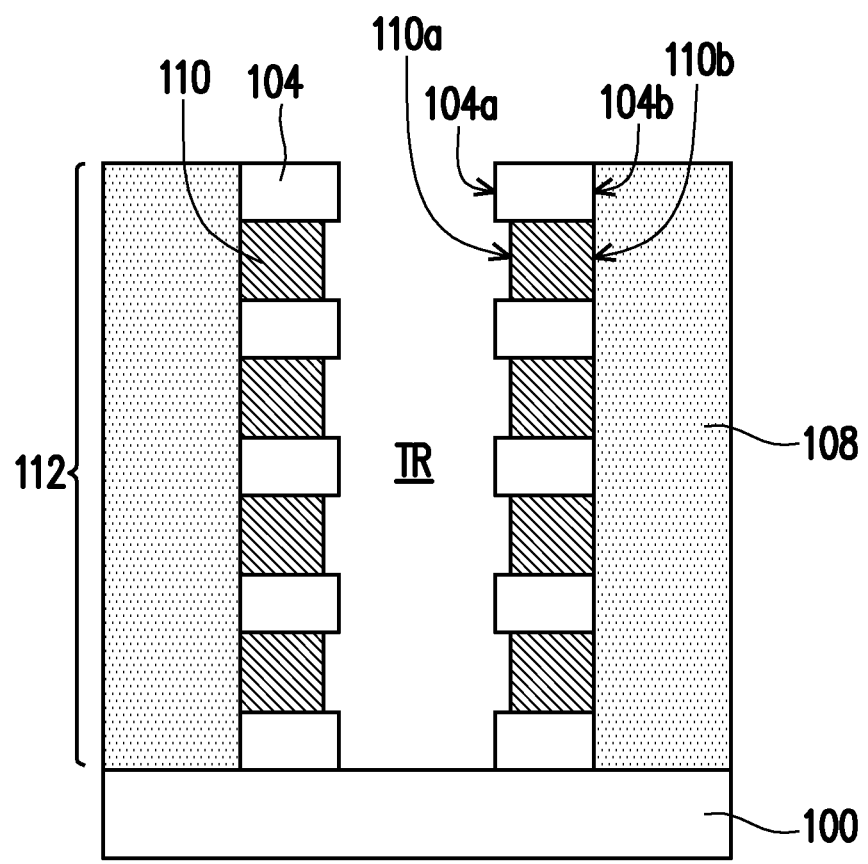
Figure 7C:
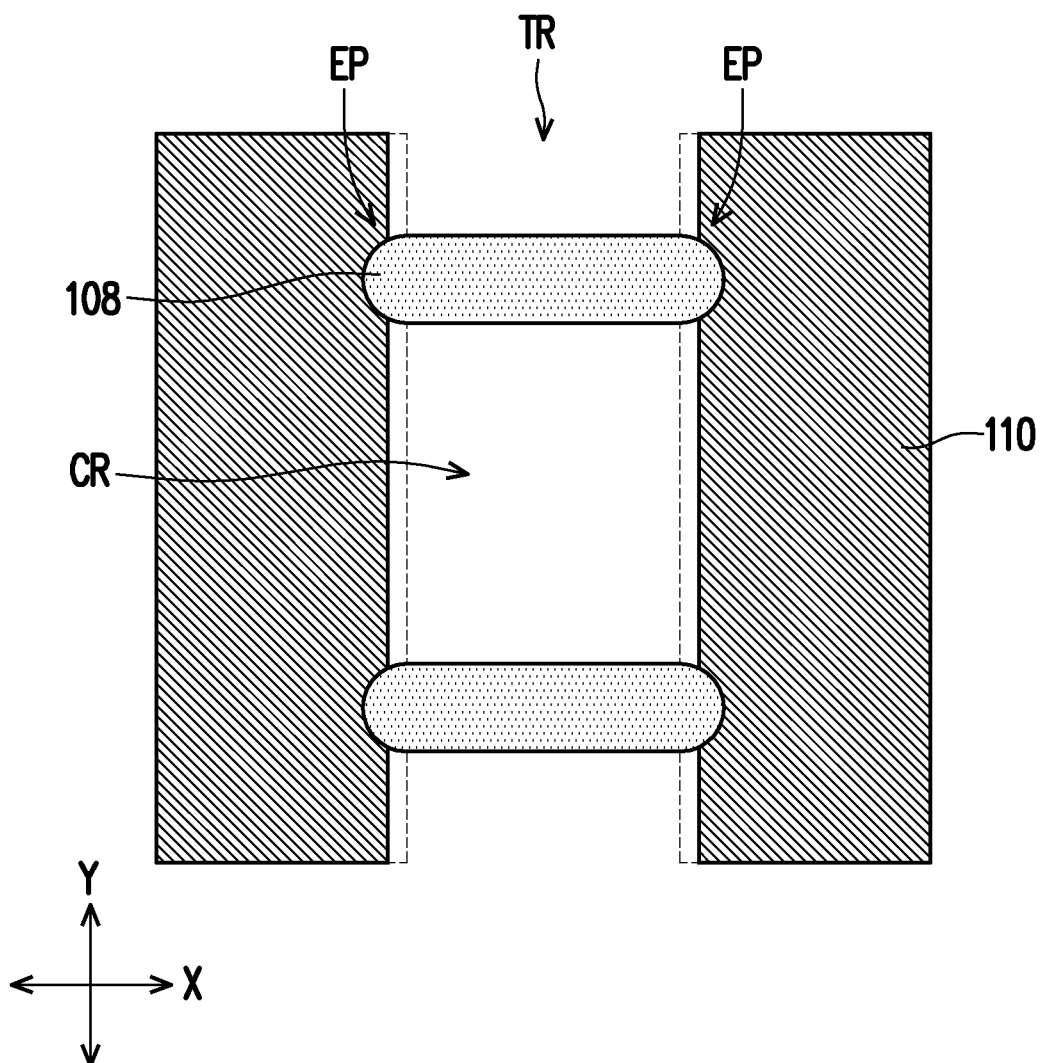

Referring to FIG. 1, FIG. 7A-7C, step S110 is performed, and the conductive layers 110 are laterally recessed with respect to the insulating layers 104. As shown in FIG. 7A and FIG. 7B, exposed sidewalls 110a of the conductive layers 110 may no longer coplanar with exposed sidewalls 104a of the insulating layers 104, but are laterally recessed from the exposed sidewalls 104a of the insulating layers 104. Further, since the isolation pillars 108 may protrude into the conductive layers 110 by a sufficient depth (as shown in FIG. 6C), the isolation pillars 108 would not be completely released from the stacking structures 112 even after the conductive layers 110 of the stacking structures 112 are laterally recessed (as shown in FIG. 7C). Instead, the end portions EP of the isolation pillars 108 are still buried in the laterally recessed conductive layers 110 and the insulating layers 104, and are in physical contact with the laterally recessed conductive layers 110 and the insulating layers 104. It should be noted that, the dash lines depicted in FIG. 7C indicate the removed portions of the conductive layers 110. Those skilled in the art may adjust the lateral recess amount of the conductive layers 110 and the depth by which the isolation pillars 108 protrude into the conductive layers 110 according to process requirements, as long as the end portions EP of the isolation pillars 108 can remain buried in and physically connected to the conductive layers 110 even after the conductive layers 110 are laterally recessed. By ensuring that the end portions EP of the isolation pillars 108 are buried in and physically connected to the laterally recessed conductive layers 110, formation of air gaps between the end portions EP of the isolation pillars 108 and the laterally recessed conductive layers 110 can be prevented. Accordingly, communication between the cell regions CR in each trench TR through the afore-mentioned air gaps can be prevented, and the subsequently formed gate dielectric layers and channel layers (e.g., gate dielectric layers 114 and the channel layers 116 to be described with reference to FIG. 8A-8C) can be respectively enclosed in one of the cell regions CR. Therefore, interference between the cells can be effectively reduced. On the other hand, as shown in FIG. 7B, sidewalls 110b, 104b of the conductive layers 110 and the insulating layers 104 in each stacking structure 112 that are in contact with the isolation pillars 108 are remained substantially coplanar with each other in the current step. In some embodiments, a method for laterally recessing the conductive layers 110 includes an etching process, such as an isotropic etching process. In these embodiments, the insulating layers 104 and the isolation pillars 108 may be barely etched during such etching process as having sufficient etching selectivity with respect to the conductive layers 110.

Figure 8A:
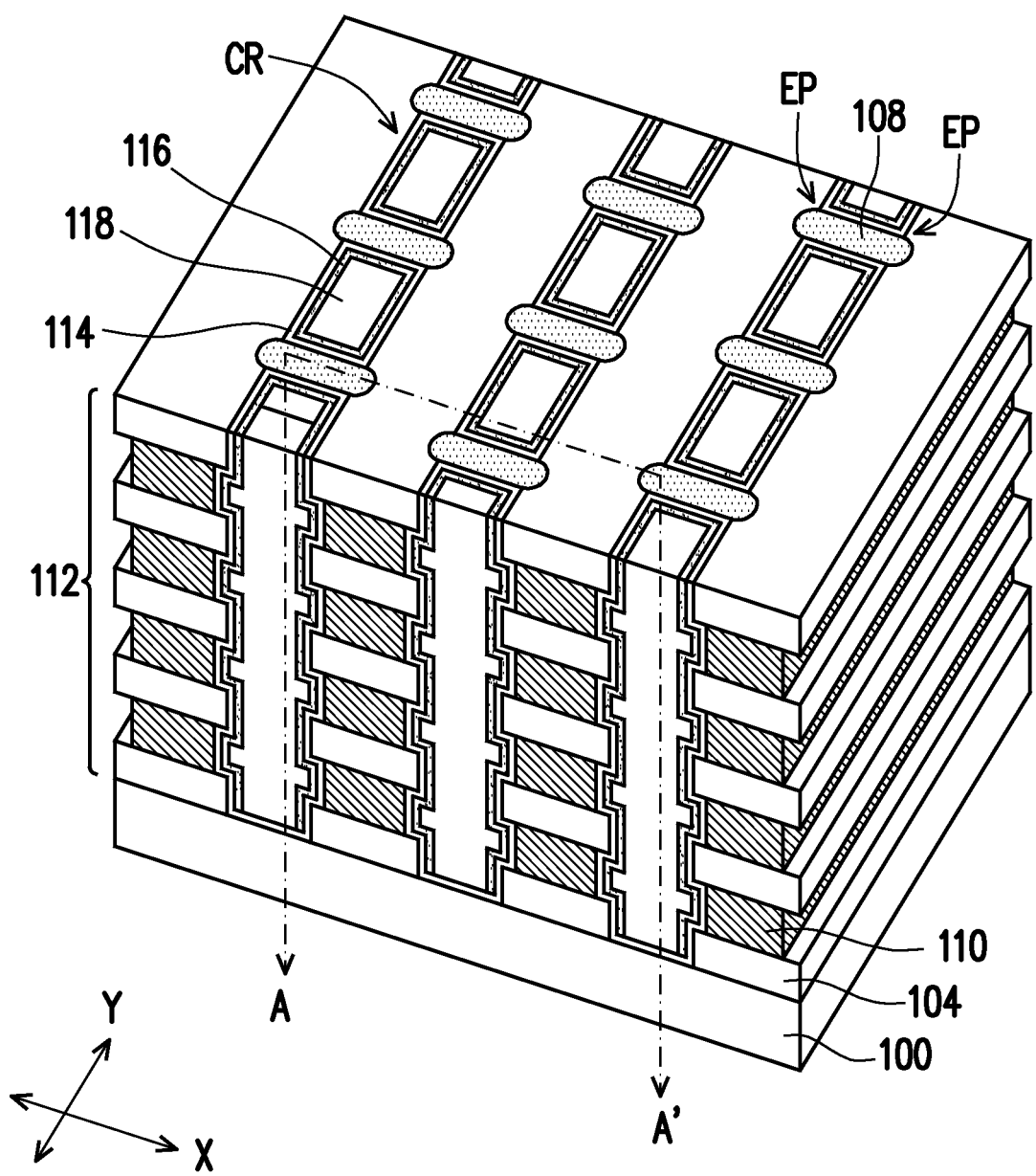
Figure 8B:
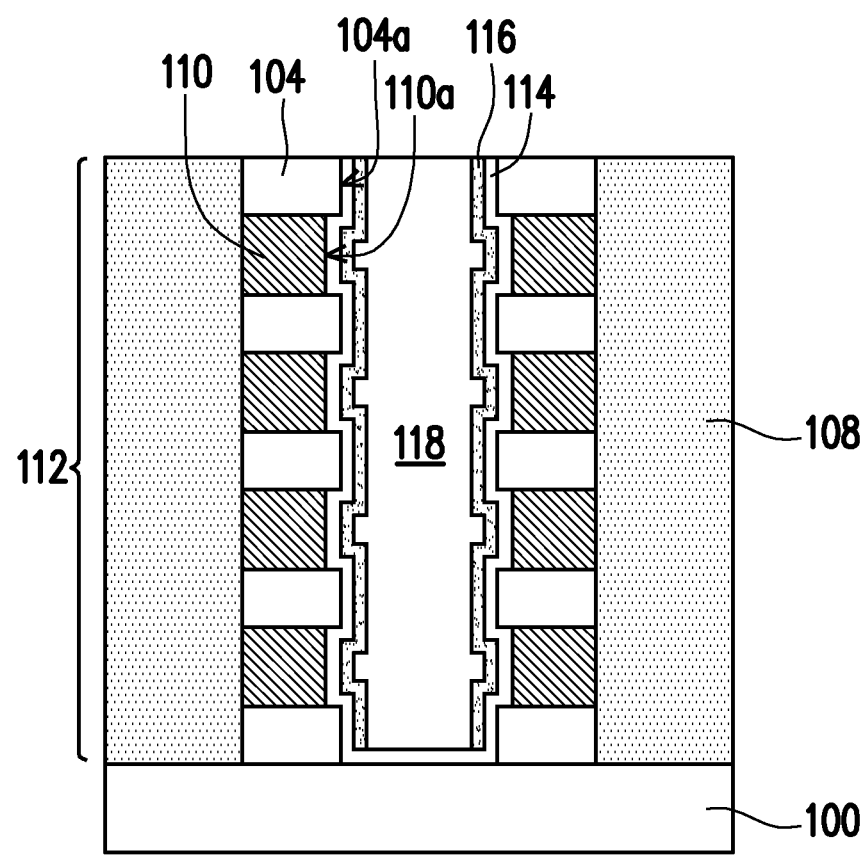
Figure 8C:
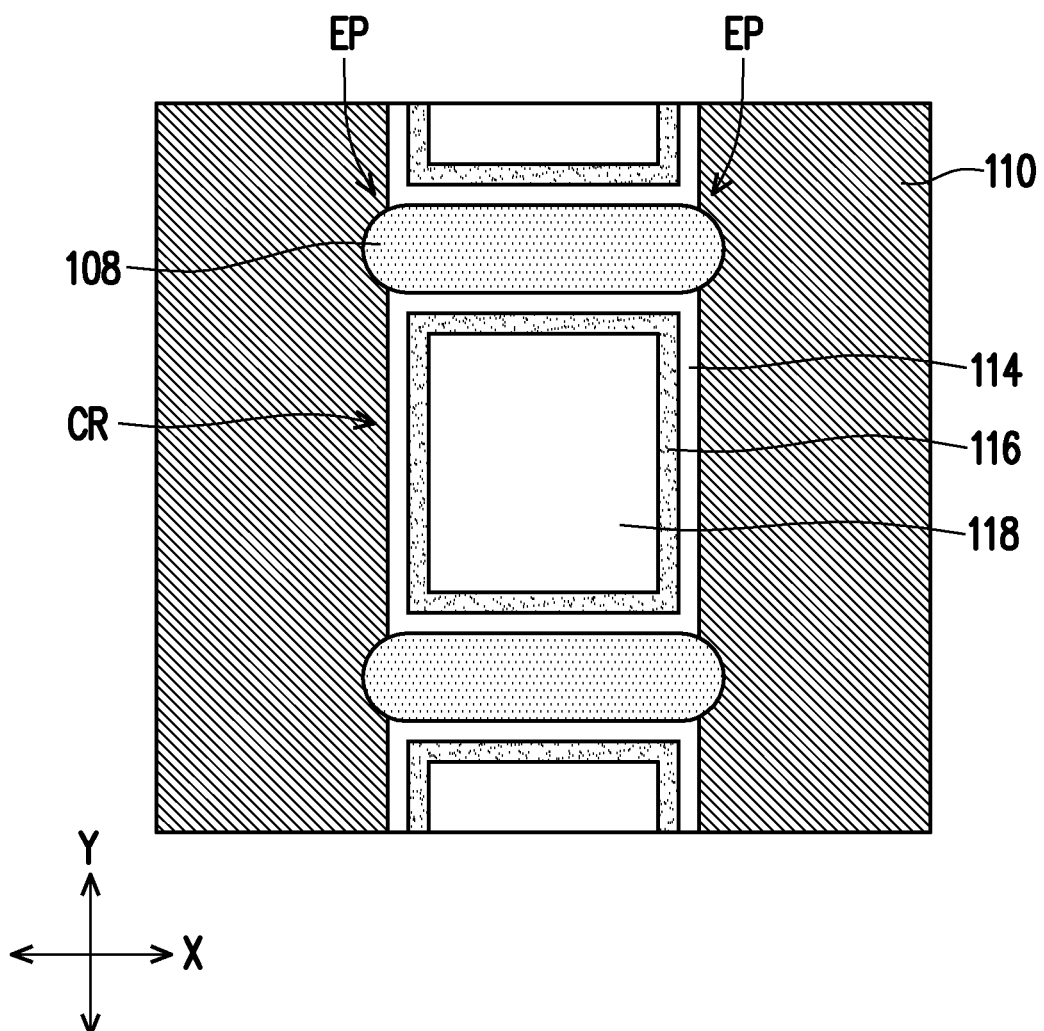

Referring to FIG. 1, FIG. 8A-8C, step S112 is performed, and gate dielectric layers 114 are formed on exposed top surfaces of the substrate 100 as well as exposed sidewalls of the stacking structures 112 (i.e., the sidewalls 104a, 110a) and the isolation pillars 108. The gate dielectric layers 114 are respectively formed in one of the cell regions CR. As described above, the cell regions CR can be prevented from communicating with one another since the end portions EP of the isolation pillars 108 protrude into and physically contact with the conductive layers 110 and the insulating layers 104. Therefore, the gate dielectric layers 114 respectively formed in one of the cell regions CR can be separated from one another. Further, as shown in FIG. 8A, the gate dielectric layers 114 may respectively be formed as having an annular top view shape. For instance, the top view of each dielectric layer 114 may appear as a substantially rectangular annulus. In some embodiments, as indicated in FIG. 8B, the gate dielectric layers 114 conformally cover the sidewalls of the stacking structures 112 and the isolation pillars 108. In those embodiments where the sidewalls 110a of the conductive layers 110 are laterally recessed with respect to the sidewalls 104a of the insulating layers 104, the gate dielectric layers 114 may be locally recessed in corresponding to the recesses of the conductive layers 110. Furthermore, as indicated in FIG. 8C, the end portions EP of the isolation pillars 108 are at least partially buried in the conductive layers 110 and the insulating layers 104 (not shown), and such buried parts of the end portions EP of the isolation pillars 108 may not be in direct contact with the gate dielectric layers 114. In some embodiments, the gate dielectric layers 114 are formed of a ferroelectric material, such as a hafnium-oxide-based material (e.g., hafnium zirconium oxide ($Hf_{1-x}Zr_xO$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium titanium oxide ($Hf_{1-x}Ti_xO$), hafnium tantalum oxide ($Hf_{1-x}Ta_xO$) or the like), barium titanate (e.g., $BaTiO_3$), lead titanate (e.g., $PbTiO_3$), lead zirconate (e.g., $PbZrO_3$), lithium niobate ($LiNbO_3$), sodium niobate ($NaNbO_3$), potassium niobate (e.g., $KNbO_3$), potassium tantalate ($KTaO_3$), bismuth scandate ($BiScO_3$), bismuth ferrite (e.g., $BiFeO_3$), aluminum scandium nitride (AlScN), the like or combinations thereof. Alternatively, the gate dielectric layers 114 are charge trap layers. For instance, the charge trap layers may include oxide-nitride-oxide (ONO) layers. In some embodiments, a method for forming the gate dielectric layers 114 includes globally forming a dielectric layer to conformally cover the structure as shown in FIG. 7A by a deposition process (e.g., a CVD process or an ALD process) or an epitaxial process. Subsequently, portions of the dielectric layer above top surfaces of the stacking structures 112 and the isolation pillars 108 may be removed by, for example, a polishing process (e.g., a CMP process), an etching process or a combination thereof. The remained portions of the dielectric layer form the gate dielectric layers 114.

Subsequently, step S114 is performed, and channel layers 116 are formed on inner surfaces of the gate dielectric layers 114. As similar to the gate dielectric layers 114, the channel layers 116 are respectively formed in one of the cell regions CR, and are ensured to be separated from one another. Also, the channel layers 116 may respectively have an annular top view shape. For instance, the top view of each channel layer 116 may appear as a substantially rectangular annulus. Moreover, in some embodiments, the channel layers 116 conformally cover the sidewalls of the stacking structures 112 and the isolation pillars 108 (as shown in FIG. 8B). In other words, the channel layers 116 may also be locally recessed in corresponding to the recesses of the conductive layers 110 and the gate dielectric layers 114. Furthermore, in some embodiments, the channel layers 116 span on the sidewalls of the stacking structures 112 and the isolation pillars 108, but may not laterally span on the top surfaces of the substrate 100 (as shown in FIG. 8A and FIG. 8B). In these embodiments, some portions of the gate dielectric layers 114 lying on the top surfaces of the substrate 100 may not be covered by the channel layers 116. In addition, each channel layer 116 can be regarded as being discontinuous at its bottommost region, and the subsequently formed conductive pillars (e.g., the conductive pillars 120 to be described with reference to FIG. 9A-9C) in each cell region CR can be prevented from being electrically connected with each other through an underlying path, which may be barely controlled by a gate voltage applied to the conductive layers 110. The channel layers 116 are formed of a semiconductor material. In some embodiments, the semiconductor material is a metal oxide material, such as an indium-based oxide material (e.g., indium gallium zinc oxide (IGZO). In addition, in some embodiments, a method for forming the channel layers 116 includes globally forming a semiconductor layer to conformally cover the gate dielectric layers 114, the substrate 100 and the stacking structures 112 by a deposition process (e.g., a physical vapor deposition (PVD) process, a CVD process or an ALD process). Subsequently, portions of the semiconductor layer above the top surfaces of the stacking structures 112 and the isolation pillars 108 as well as portions of the semiconductor layer lying on the substrate 100 may be removed by, for example, an etching process (e.g., an anisotropic etching process). The remained portions of the semiconductor layer form the channel layers 116.

Thereafter, step S116 is performed, and insulating structures 118 are formed to fill up the cell regions CR. As shown in FIG. 8A and FIG. 8B, the insulating structures 118 respectively stand in one of the cell regions CR, and are laterally surrounded by the channel layers 116 and the gate dielectric layers 114. In those embodiments where the channel layers 116 do not laterally span on the top surfaces of the substrate 100, the insulating structures 118 may stand on the bottommost portions of the gate dielectric layers 114. Further, in those embodiments where the gate dielectric layers 114 and the channel layers 116 are locally recessed in corresponding to the recesses at the sidewalls of the stacking structures 112, the recesses at the surfaces of the channel layers 116 are filled up by the insulating structures 118, and the insulating structures 118 have laterally protruding portions in corresponding to the recesses at the surfaces of the channel layers 116. The insulating structures 118 are formed of an insulating material. For instance, the insulating material may include silicon oxide, silicon nitride, silicon oxynitride, or the like. In some embodiments, a method for forming the insulating structures 118 includes filling up the cell regions CR with the insulating material by a deposition process, such as a CVD process. Subsequently, a planarization process may be performed to remove portions of the insulating material above the top surfaces of the stacking structures 112 and the isolation pillars 108, and the planarization process may include a CMP process, an etching process or a combination thereof. The remained portions of the insulating material form the insulating structures 118.

Figure 9A:
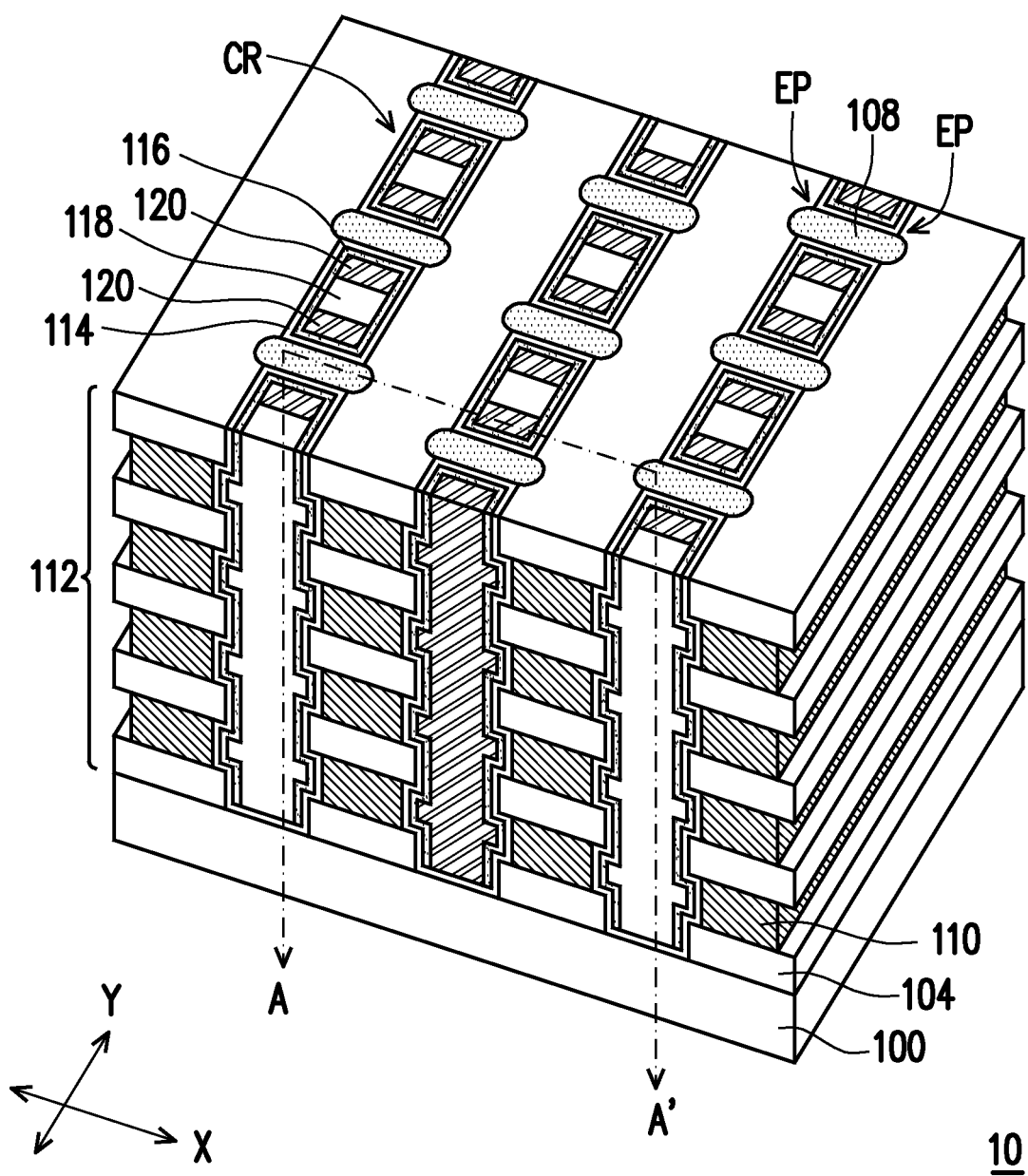
Figure 9B:
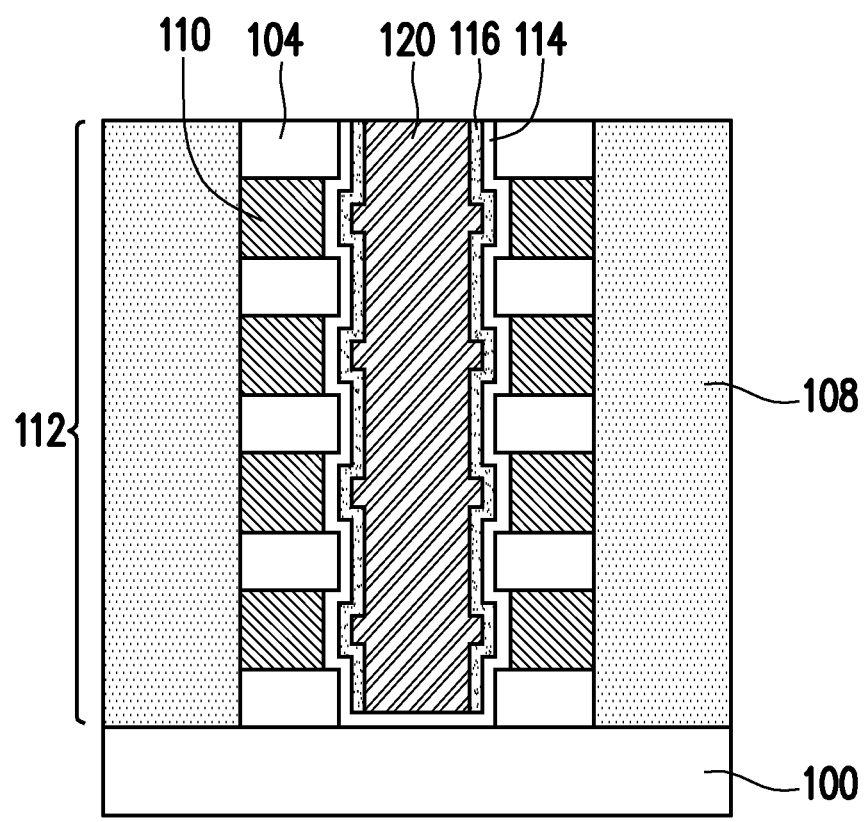

Referring to FIG. 1, FIG. 9A-9C, step S118 is performed, and conductive pillars 120 are formed within the cell regions CR. The conductive pillars 120 penetrate through the insulating structures 118, and may reach to the bottommost portions of the gate dielectric layers 114. A pair of the conductive pillars 120 are disposed in each of the cell regions CR, and are separated from each other. In this way, pairs of the conductive pillars 120 (each pair as a single unit) are arranged in columns extending along the direction Y and separated from one another by the direction X. In some embodiments, sections of each insulating structure 118 that are closest to the most adjacent isolation pillars 108 can be regarded as being replaced by a pair of the conductive pillars 120, and the remained section of each insulating structure 118 is located between the pair of the conductive pillars 120. As similar to the insulating structures 118, the conductive pillars 120 may laterally protrude in corresponding to the recesses of the channel layers 116 (as shown in FIG. 9B). Further, in those embodiments where the columns of the cell regions CR are alternately offset from others, the columns of the pairs of conductive pillars 120 are alternately offset from others. For instance, even columns of the pairs of the conductive pillars 120 are offset from odd columns of the pairs of the conductive pillars 120 along the direction Y. Moreover, as described with reference to FIG. 9A and FIG. 9B, since the channel layers 116 may not laterally span on the top surfaces of the substrate 100, each pair of the conductive pillars 120 in one of the cell regions CR can be prevented from being electrically connected with each other through an underlying path, which may be barely controlled by a gate voltage applied to the conductive layers 110. A method for forming the conductive pillars 120 may include forming through holes in the insulating structures 118 by using a lithography process and an etching process (e.g., an anisotropic etching process), and filling a conductive material into these through holes by a deposition process (e.g., a CVD process or a PVD process), a plating process or a combination thereof. Subsequently, portions of the conductive material above the stacking structures 102 and the isolation pillars 108 are removed by a planarization process, and remained portions of the conductive material form the conductive pillars 120. For instance, the planarization process may include a CMP process, an etching process or a combination thereof.

Figure 9C:
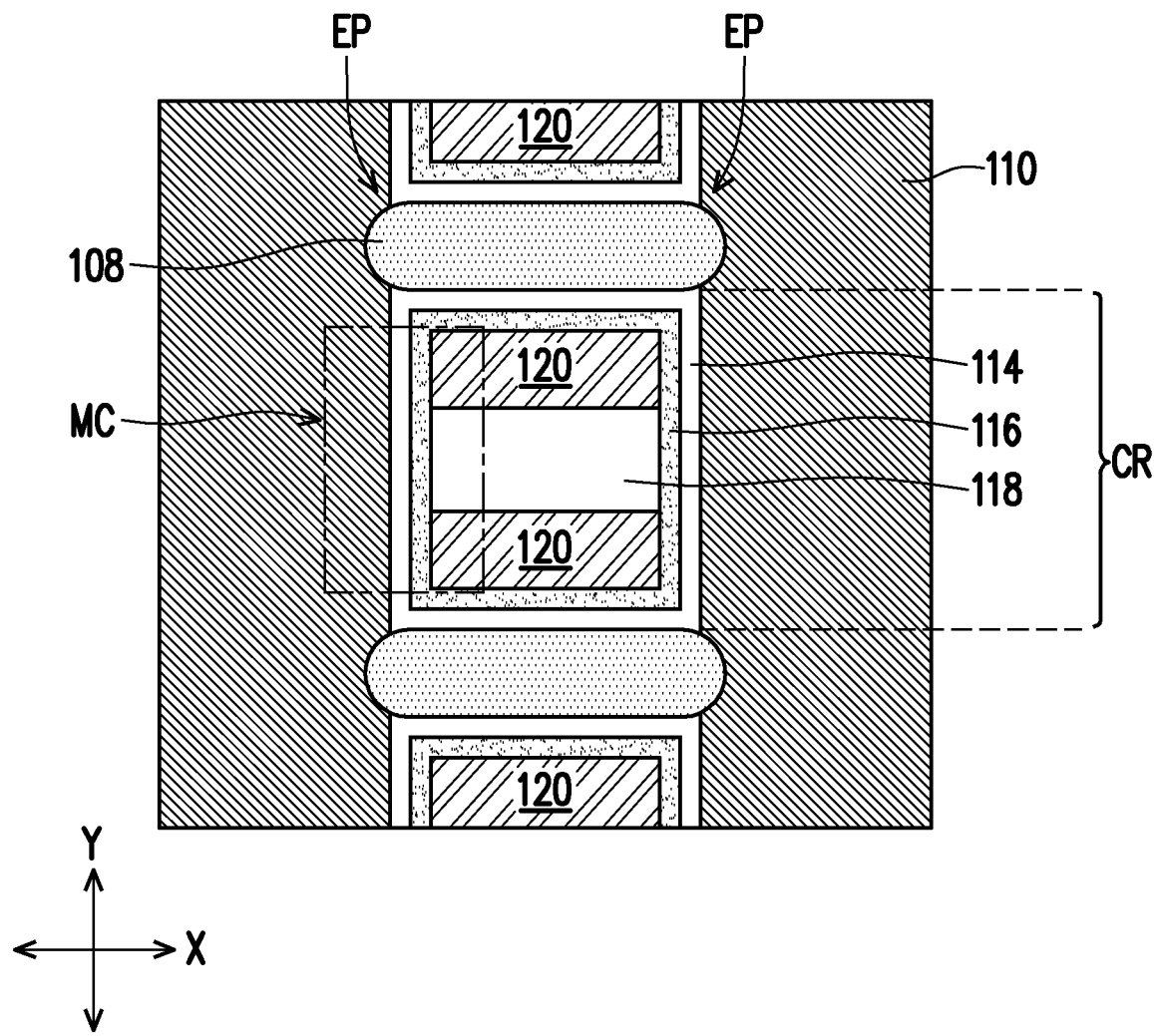

Up to here, the three-dimensional memory device 10 according to some embodiments of the present disclosure has been formed. Referring to FIG. 9A and FIG. 9B, the three-dimensional memory device 10 includes the stacking structures 112 laterally spaced apart from one another by trenches (as described with reference to FIG. 6A), and includes the isolation pillars 108 intersected with the trenches and dividing each of the trenches into multiple cell regions CR. Further, the three-dimensional memory device 10 also includes the gate dielectric layers 114 and the channel layers 116 lining on inner sidewalls of the cell regions CR, and includes pairs of the conductive pillars 120 each separately located within each of the cell regions CR and laterally surrounded by the gate dielectric layer 114 and the channel layer 116 in the same cell region CR. As shown in FIG. 9C, a portion of the conductive layer 110 in each stacking structure 112 and closest portions of the gate dielectric layer 114, the channel layer 116 and the conductive pillars 120 in a cell region CR laterally adjacent to this portion of the conductive layer 110 constitute a field effect transistor (FET), which is functioned as a memory cell MC. In those embodiments where the gate dielectric layers 114 are formed of a ferroelectric material, dipole moments in opposite directions can be stored in the gate dielectric layer 114. Accordingly, the FET has different threshold voltages in corresponding to the dipole moments, thus the FET can be identified as having different logic states. In these embodiments, the memory cell MC is a ferroelectric FET. On the other hand, in those embodiments where the gate dielectric layer 114 is a charge trap layer, charges may be stored in the gate dielectric layer 114, thus the FET may have different threshold voltages depending on the amount of charge stored in the gate dielectric layer 114. Accordingly, the FET can be identified as having different logic states as well. In these embodiments, the memory cell MC may be referred as a charge trap flash (CTF) transistor.

Further, as shown in FIG. 9A and FIG. 9C, the conductive layers 110 stacked along a vertical direction in each stacking structure 112 as well as portions of the gate dielectric layer 114, the channel layer 116 and the pair of conductive pillars 120 in a cell region CR aside these conductive layers 110 form a stack of memory cells MC. In addition, multiple stacks of the memory cells MC may be arranged along the trench direction (e.g., the direction Y). In some embodiments, the gate dielectric layer 114, the channel layer 116 and a pair of conductive pillars 120 in the same cell region CR are shared by adjacent stacks of memory cells MC including the conductive layers 110 at opposite sides of this cell region CR, and conductive channels of these memory cells MC are formed in different sections of the channel layer 116.

In regarding the isolation pillars 108 that divide the trenches into multiple cell regions CR, the isolation pillars 108 further protrude into the stacking structures 112, such that the conductive layers 110 and the insulating layers 104 in the stacking structures 112 can keep in physical contact with the isolation pillars 108 even after the conductive layers 110 are laterally recessed. Therefore, gaps are absent between the isolation pillars 108 and the stacking structures 112, thus adjacent cell regions CR can be prevented from communicating with each other through these gaps. Consequently, the gate dielectric layers 114 within adjacent cell regions CR can be prevented from being in contact with each other. Similarly, the channel layers 116 within adjacent cell regions CR can be prevented from being in contact with each other as well. As a result, interference of adjacent memory cells MC separated by the isolation pillars 108 extending in between can be effectively prevented.

Figure 10:
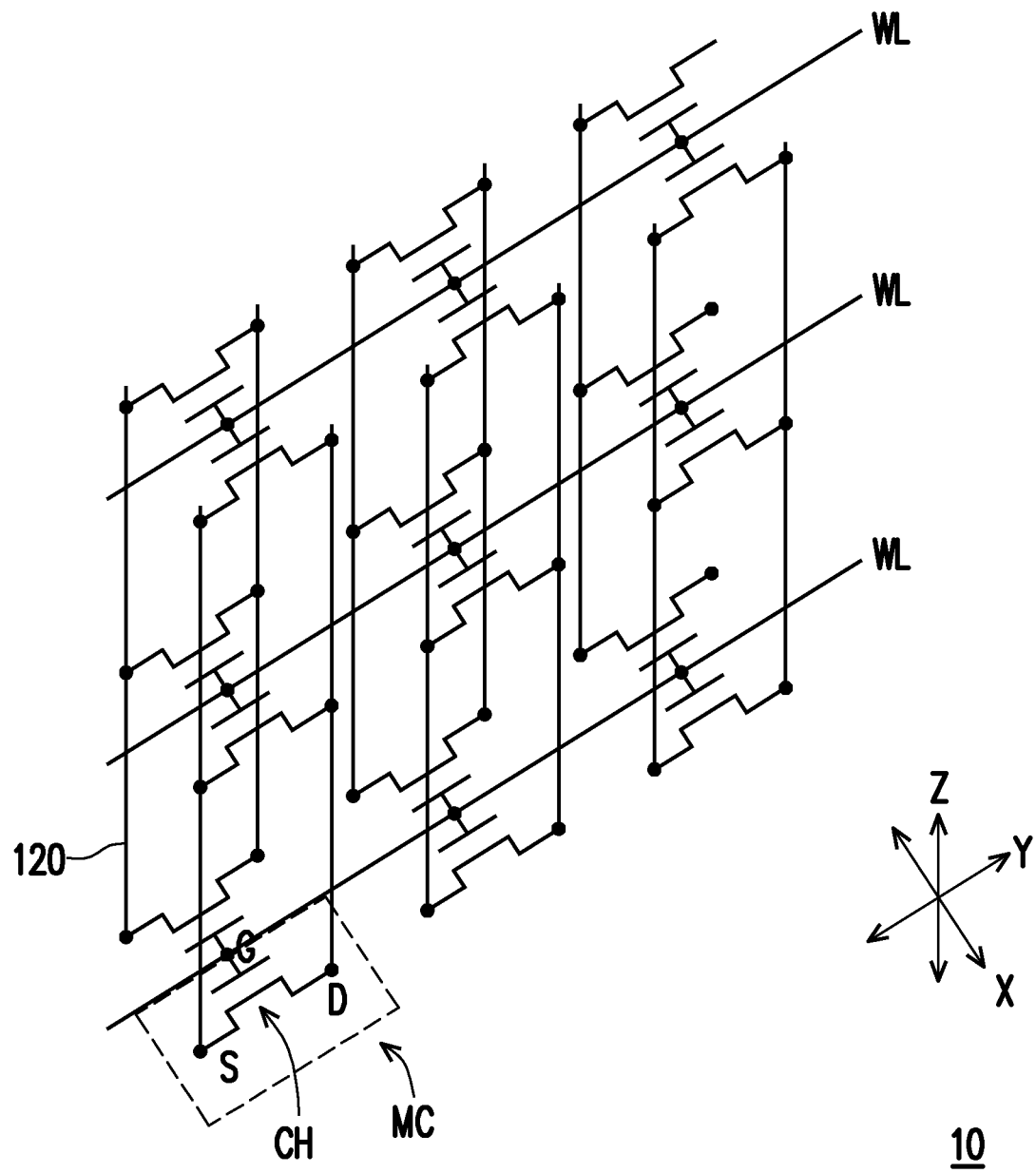
FIG. 10 is an equivalent circuit diagram of a portion of the three-dimensional memory device shown in FIG. 9A.

FIG. 10 is an equivalent circuit diagram of a portion of the three-dimensional memory device 10 shown in FIG. 9A.

Referring to FIG. 9A and FIG. 10, the conductive layers 110 in each stacking structure 112 shown in FIG. 9A may be functioned as word lines WL as shown in FIG. 10. The word lines WL are arranged along a vertical direction Z. Each word line WL connects gate terminals G of two laterally adjacent columns of the memory cells MC. In addition, each pair of conductive pillars 120 in one of the cell regions CR shown in FIG. 9A separately connect to source and drain terminals S, D of the memory cells MC stacked along the vertical direction Z as shown in FIG. 10. As shown in FIG. 10, the gate terminals G of each stack of the memory cells MC are respectively connected to one of the word lines WL. In addition, the source terminals S of each stack of the memory cells MC are connected together by one of the conductive pillars 120, and the drain terminals D of each stack of the memory cells MC are connected together by another one of the conductive pillars 120. In other words, channels CH between the source and drain terminals S, D of each stack of the memory cells MC are connected in parallel.

Figure 11:
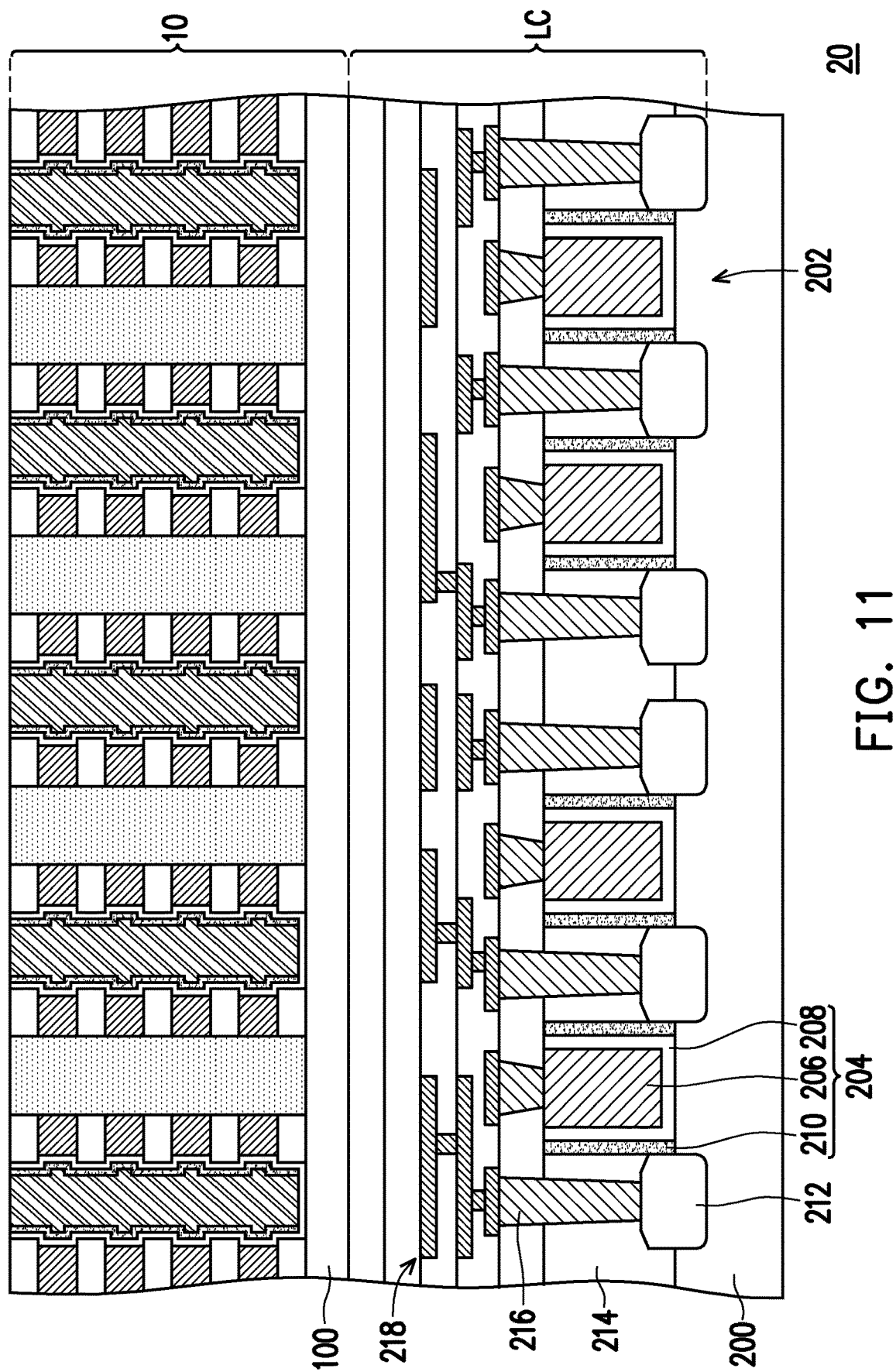
FIG. 11 is a schematic cross-sectional view illustrating a semiconductor structure according to some embodiments of the present disclosure.

FIG. 11 is a schematic cross-sectional view illustrating a semiconductor structure 20 according to some embodiments of the present disclosure.

Referring to FIG. 9A-9C and FIG. 11, the semiconductor structure 20 shown in FIG. 11 includes the three-dimensional memory device 10 as described with reference to FIG. 9A-9C. In those embodiments where the substrate 100 of the three-dimensional memory device 10 is an etching stop layer, a CMOS integrated circuit LC may lie under the substrate 100, and the CMOS integrated circuit LC may also be referred as a CMOS-under-array (CUA). Although not shown, the conductive layers 110 and the conductive pillars 120 may be routed to the CMOS integrated circuit LC, and the three-dimensional memory device 10 may be controlled by the CMOS integrated circuit LC.

In some embodiments, the CMOS integrated circuit LC is built on a semiconductor substrate 200. The semiconductor substrate 200 may be a semiconductor wafer or a semiconductor-on-insulator (SOI) wafer. The CMOS integrated circuit LC may include active devices formed on a surface region of the semiconductor substrate 200. In some embodiments, the active devices include metal-oxide-semiconductor (MOS) transistors 202. The MOS transistors 202 may respectively include a gate structure 204 formed over the semiconductor substrate 200. In some embodiments, the gate structure 204 includes a gate electrode 206, a gate dielectric layer 208 and a gate spacer 210. The gate dielectric layer 208 may spread between the gate electrode 206 and the semiconductor substrate 200, and may or may not further cover a sidewall of the gate electrode 206. The gate spacer 210 may laterally surround the gate electrode 206 and the gate dielectric layer 208. Further, the MOS transistor 202 may further include source/drain regions 212. The source/drain regions 212 may be formed in the semiconductor substrate 100, and are located at opposite sides of the gate structure 204. In some embodiments, the source/drain regions 212 may be epitaxial structures, and may protrude from a surface of the semiconductor substrate 200. It should be noted that, although the MOS transistors 202 are depicted as planar-type MOS transistors that forms conductive channels (not shown) along the surface of the semiconductor substrate 200, the MOS transistors 202 may alternatively be fin-type MOS transistors (or referred as finFET), gate-all-around (GAA) FETs or the like.

In some embodiments, the CMOS integrated circuit LC further includes dielectric layers 214 stacked on the semiconductor substrate 200, and includes contact plugs 216 and interconnections 218 formed in the stack of dielectric layers 214. A bottommost dielectric layer 214 may laterally surround the gate structures 204, and cover the source/drain regions 212. Some of the contact plugs 216 may penetrate through bottommost ones of the dielectric layers 214, in order to establish electrical connection with the source/drain regions 212, while others of the contact plugs 216 may stand on the gate structures 204 and electrically connect to the gate electrodes 206 of the gate structures 204. The interconnections 218 may spread on the contact plugs 216, and are electrically connected to the contact plugs 216. The interconnections 218 may include conductive traces and conductive vias. The conductive traces respectively lie on one of the dielectric layers 214, whereas the conductive vias respectively penetrate through one or more of the dielectric layers 214 and electrically connect to one or more of the conductive traces.

In some embodiments, the three-dimensional memory device 10 is disposed on the stack of dielectric layers 214. In these embodiments, the conductive layers 110 and the conductive pillars 120 of the three-dimensional memory device 10 may be routed to the interconnections 218 in the stack of dielectric layers 214 by conductive paths (not shown) extending through the substrate 100 and topmost ones of the dielectric layers 214. For instance, the conductive layers 110 (or referred as word lines) may be routed to word line drivers formed by some of the active devices interconnected by a portion of the interconnections 218, and the conductive pillars 120 may be routed to sense amplifiers formed by others of the active devices interconnected by another portion of the interconnections 218.

Figure 12A:
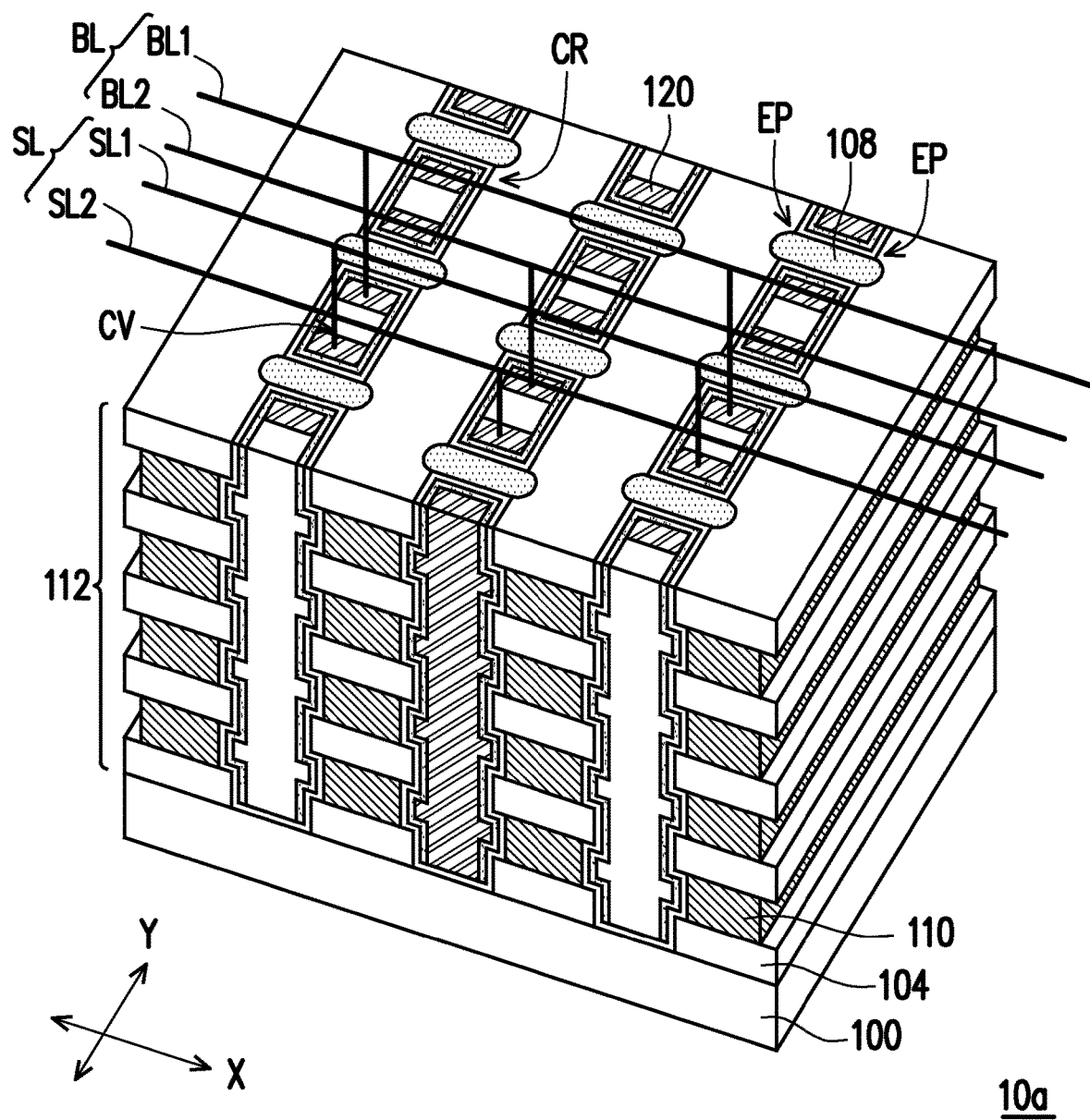
FIG. 12A is a schematic three-dimensional view illustrating a three-dimensional memory device according to some embodiments of the present disclosure.
Figure 12B:
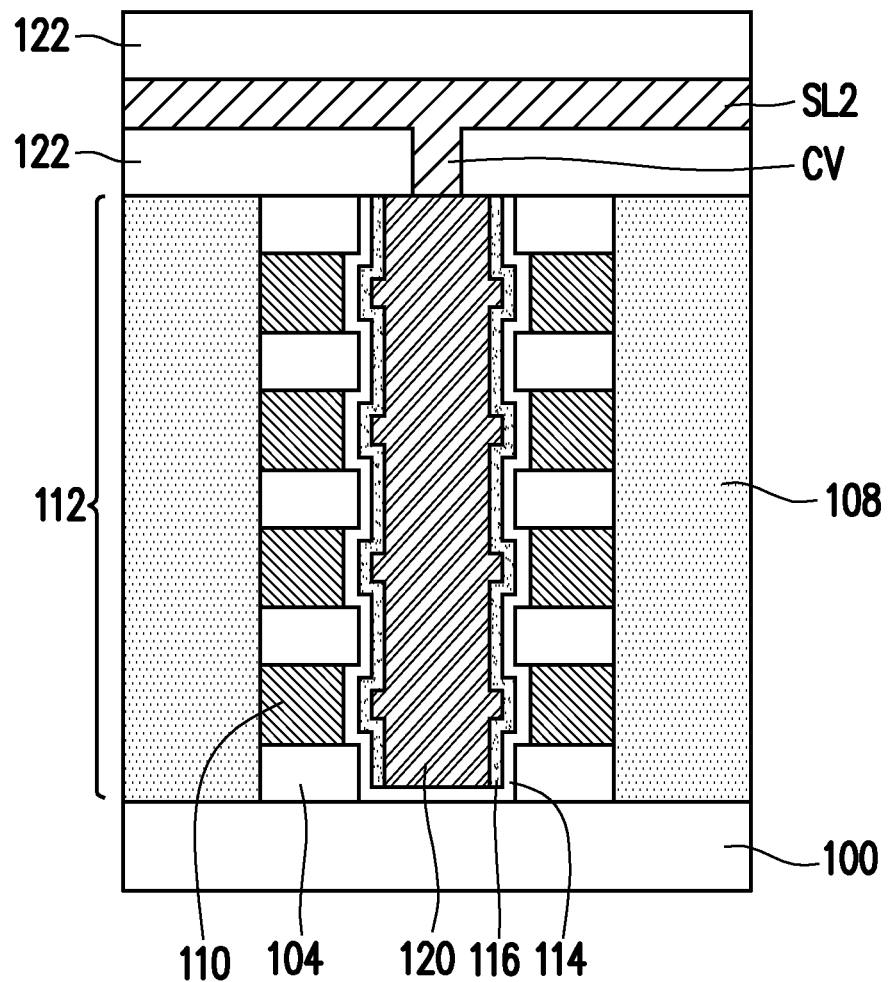
FIG. 12B is a schematic cross-sectional view along an extending direction of one of the source line and bit lines shown in FIG. 12A.

FIG. 12A is a schematic three-dimensional view illustrating a three-dimensional memory device 10a according to some embodiments of the present disclosure. FIG. 12B is a schematic cross-sectional view along an extending direction of the source line SL2 shown in FIG. 12A. The three-dimensional memory device 10a shown in FIG. 12A and FIG. 12B is similar to the three-dimensional memory device 10 as described with reference to FIG. 9A-9C. Only differences therebetween will be described, the same or the like part would not be repeated again. In addition, the dielectric layers 122 to be described with reference to FIG. 12B are omitted in FIG. 12A.

Referring to FIG. 12A, in some embodiments, the three-dimensional memory device 10a further includes bit lines BL and source lines SL. The bit lines BL and the source lines SL are electrically connected to the conductive pillars 120 through, for example, conductive vias CV. The conductive pillars 120 in each one of the cell regions CR are connected to one of the bit lines BL and one of the source lines SL, respectively. In some embodiments, the bit lines BL and the source lines SL extend along a row direction (e.g., the direction X) intersected with the column direction (e.g., the direction Y) along which the cell regions CR between adjacent stacking structures 112 are arranged. In those embodiments where columns of the cell regions CR are alternately offset from others, the conductive pillars 120 in adjacent columns of the cell regions CR may be connected to different bit lines BL and different source lines SL. For instance, the conductive pillars 120 in odd columns of the cell regions CR may be connected to bit lines BL1 and source lines SL1, whereas the conductive pillars 120 in even column of the cell regions CR may be connected to bit lines BL2 and source lines SL2. Accordingly, the memory cells MC in adjacent columns of the cell regions CR can be controlled by different bit lines BL (e.g., the bit lines BL1 and the bit lines BL2) and different source lines SL (e.g., the source lines SL1 and the source lines SL2), thus interference between the memory cells MC in adjacent columns of the cell regions CR can be reduced.

Referring to FIG. 12A and FIG. 12B, in some embodiments, the bit lines BL and the source lines SL extend above the stacking structures 112. The bit lines BL, the source lines SL and the conductive vias CV may be formed in a stack of dielectric layers 122 formed on the stacking structures 112. The conductive vias CV may penetrate through bottommost one(s) of the dielectric layers 122, to establish electrical connection from the conductive pillars 120 to the bit lines BL and the source lines SL lying above the conductive vias CV. In those embodiments where the substrate 100 is an etching stop layer formed over a CMOS integrated circuit (e.g., the CMOS integrated circuit LC as described with reference to FIG. 11), the bit lines BL and the source lines SL may be further routed to the underlying CMOS integrated circuit through a conductive path (not shown) formed aside the stacking structures 112 and penetrating through the substrate 100.

Figure 13A:
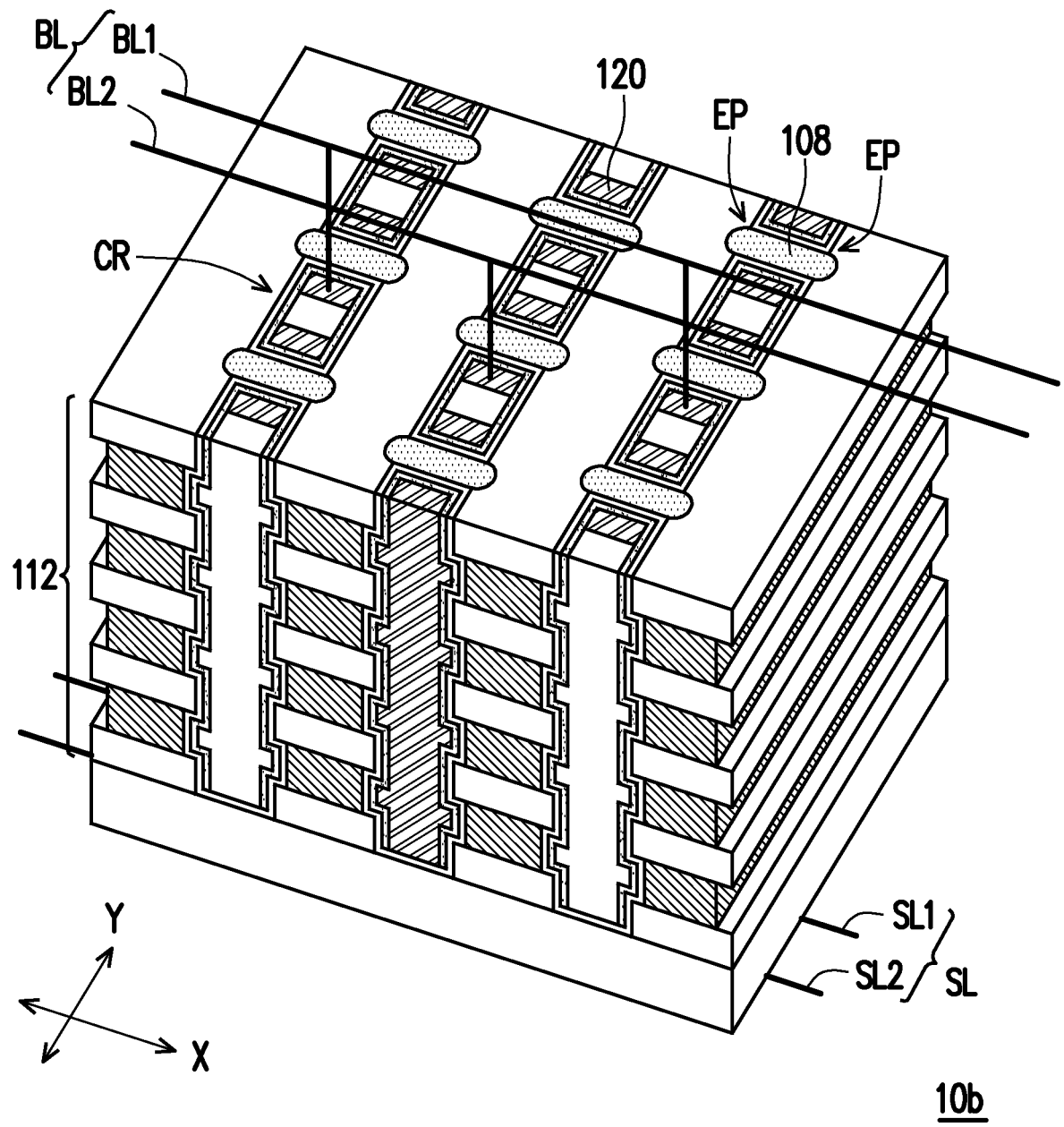
FIG. 13A is a schematic three-dimensional view illustrating a three-dimensional memory device according to some embodiments of the present disclosure.
Figure 13B:
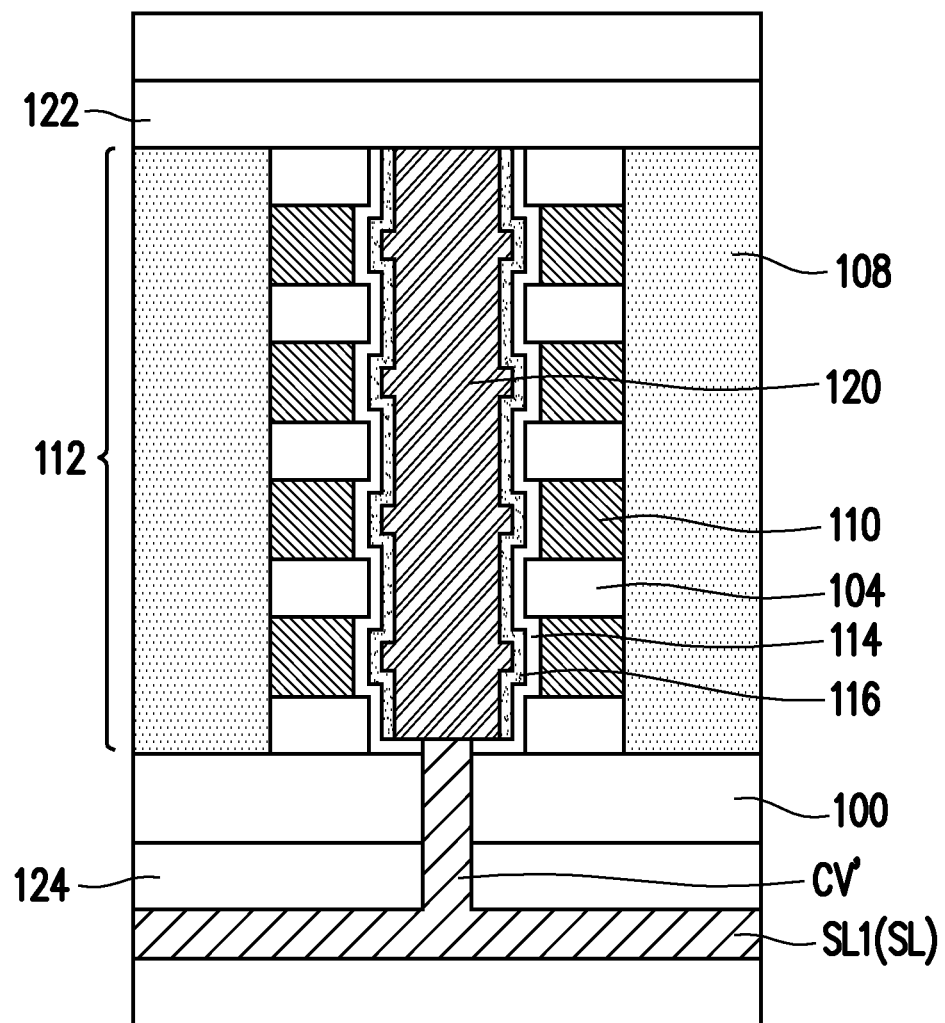
FIG. 13B is a schematic cross-sectional view along one of the source lines shown in FIG. 13A.

FIG. 13A is a schematic three-dimensional view illustrating a three-dimensional memory device 10b according to some embodiments of the present disclosure. FIG. 13B is a schematic cross-sectional view along an extending direction of one of the source lines SL shown in FIG. 13A. The three-dimensional memory device 10b shown in FIG. 13A and FIG. 13B is similar to the three-dimensional memory device 10a as described with reference to FIG. 12A and FIG. 12B. Only differences therebetween will be described, the same or the like part would not be repeated again.

Referring to FIG. 13A and FIG. 13B, in some embodiments, the source lines SL extend below the substrate 100, while the bit lines BL extend above the stacking structures 112. In these embodiments, as shown in FIG. 13B, the source lines SL may be formed in the stack of dielectric layers 214 (as described with reference to FIG. 11) below the substrate 100. The source lines SL may lie on one of the dielectric layers 214. In addition, conductive vias CV' may be further formed to electrically connect some of the conductive pillars 120 to the underlying source lines SL. The conductive vias CV' may extend from bottom surfaces of some of the conductive pillars 120, and penetrate through the underlying gate dielectric layers 114, the substrate 100 and topmost one(s) of the dielectric layers 214, to reach the source lines SL.

In alternative embodiments, locations of the source lines SL and the bit lines BL are switched. In other words, the source lines SL may extend above the stacking structures 112, and may be electrically connected to some of the conductive pillars 120 as described with reference to FIG. 12A and FIG. 12B. On the other hand, the bit lines BL may extend in the dielectric layers 214 below the stacking structures 112, and may be electrically connected to others of the conductive pillars 120 through the conductive vias CV'.

Figure 14:
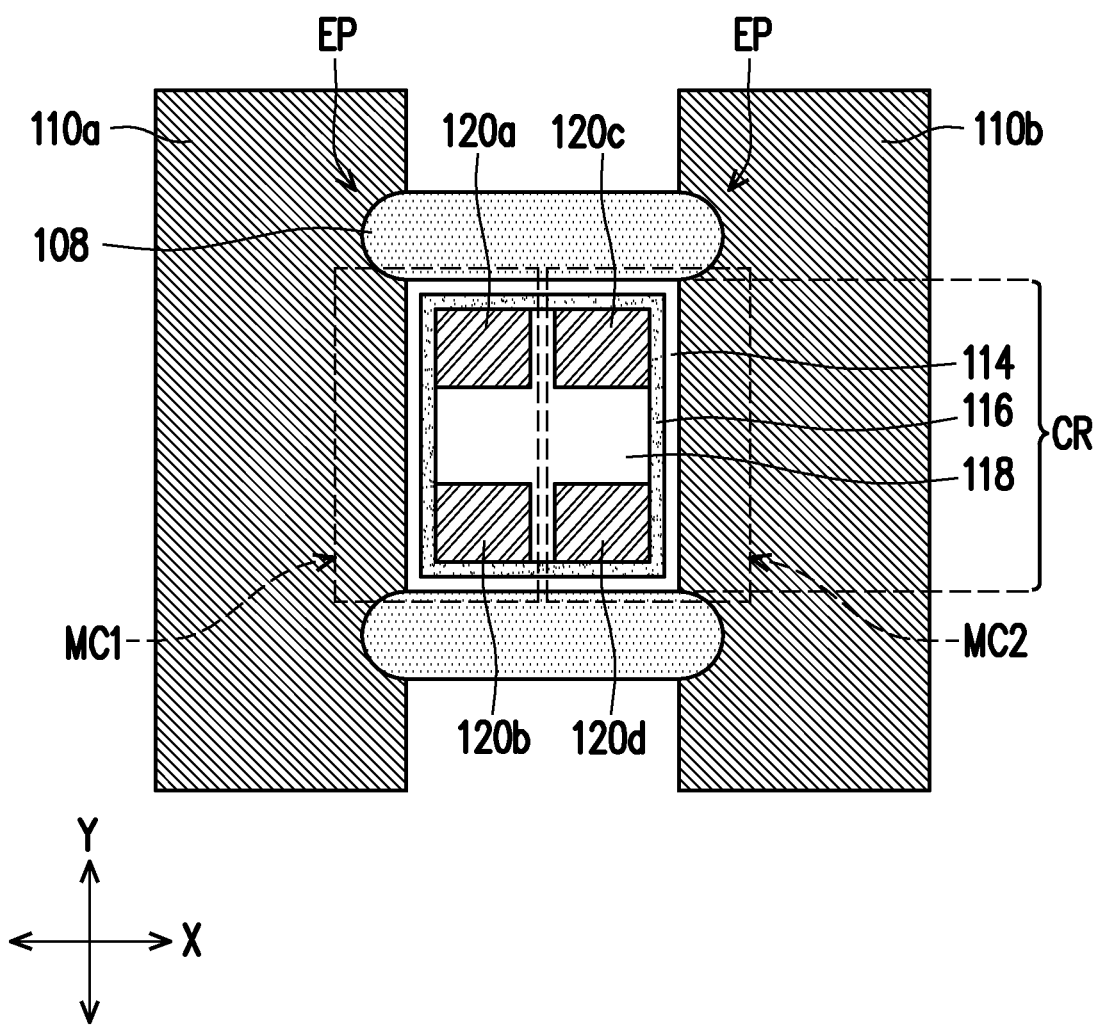
FIG. 14 is a schematic plan view illustrating laterally adjacent memory cells in a three-dimensional memory device according to some embodiments of the present disclosure.

FIG. 14 is a schematic plan view illustrating laterally adjacent memory cells MC1, MC2 in a three-dimensional memory device according to some embodiments of the present disclosure. Such three-dimensional memory device is similar to the three-dimensional memory device 10 as described with reference to FIG. 9A-9C. Only differences therebween will be described, the same or the like parts would not be repeated again.

Referring to FIG. 14, in some embodiments, two pairs of conductive pillars 120 are disposed in each cell region CR. Laterally adjacent memory cells MC1, MC2 using two of the conductive layers 110 at opposite sides of a cell region CR respectively include one of the two pairs of conductive pillars 120. For instance, the memory cell MC1 using a conductive layer 110a at a side of the cell region CR includes conductive pillars 120a, 120b within this cell region CR. On the other hand, the memory cell MC2 using a conductive layer 110b at the other side of the cell region CR includes conductive pillars 120c, 120d within this cell region CR. The conductive pillars 120a, 120b are separately in contact with a section of the channel layer 116 lining along the conductive layer 110a, while the conductive pillars 120c, 120b may be separately in contact with another section of the channel layer 116 lining along the conductive layer 110b. For instance, the cell region CR may have a substantially rectangular top view shape, and the conductive pillars 120a, 120b, 120c, 120d are separately located at four corners of the cell region CR. The conductive pillars 120a, 120b are functioned as source and drain terminals of the memory cell MC1. Similarly, the conductive pillars 120c, 120d are functioned as source and drain terminals of the memory cell MC2. Since the laterally adjacent memory cells (e.g., the memory cells MC1, MC2) respectively have their own pair of source and drain terminals, interference between the laterally adjacent memory cells (e.g., the memory cells MC1, MC2) may be further reduced. In order to place two pairs of the conductive pillars 120 within each of the cell regions CR, those skilled in the art may adjust dimensions of the cell regions CR and/or dimensions of the conductive pillars 120, such that the cell regions CR each shown in FIG. 14 may be larger than each cell region CR shown in FIG. 9A, and/or the dimensions of the conductive pillars 120 shown in FIG. 14 may be smaller than dimensions of the conductive pillars 120 shown in FIG. 9A.

Figure 15:
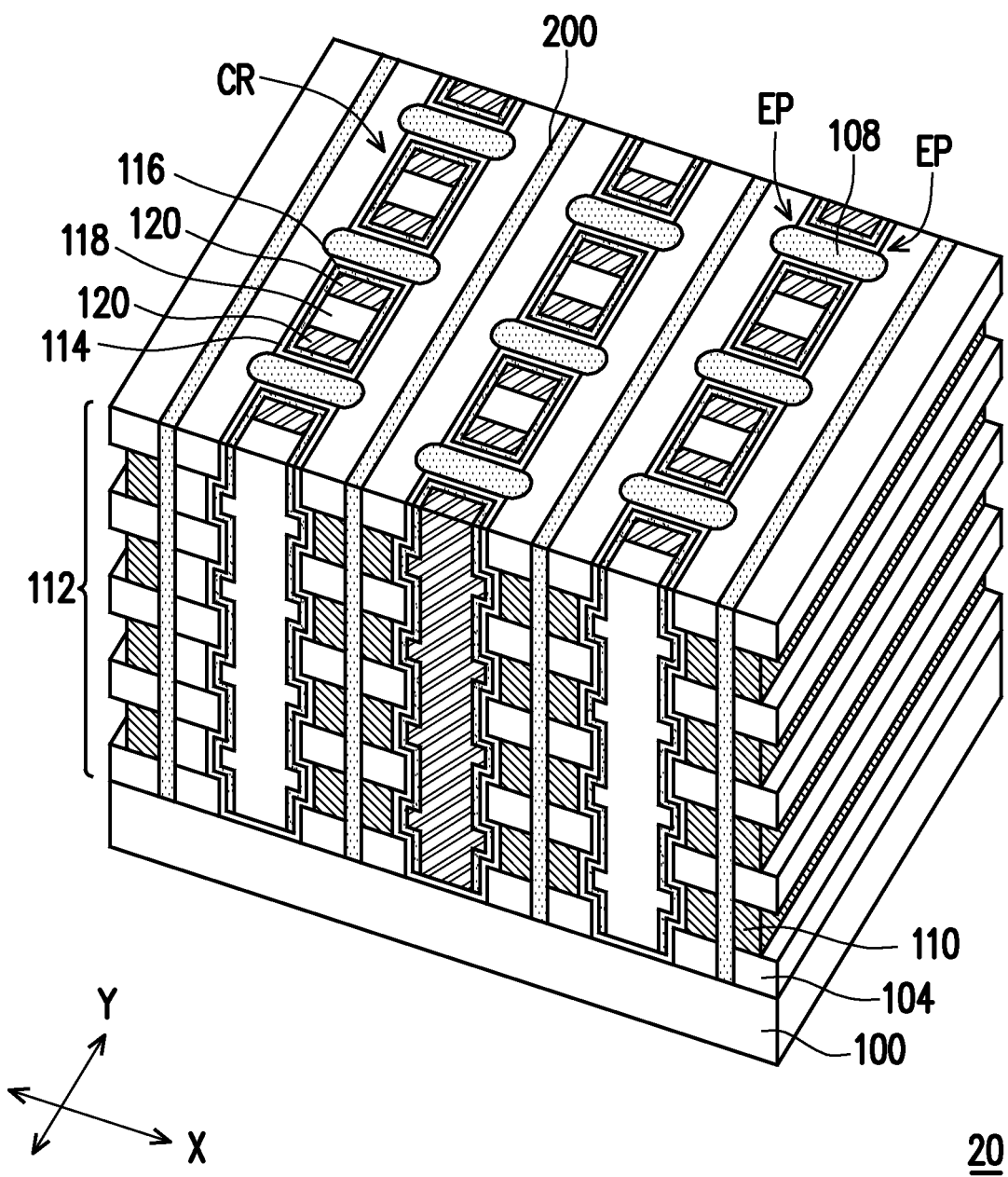
FIG. 15 a schematic three-dimensional view illustrating a three-dimensional memory device according to some embodiments of the present disclosure.

FIG. 15 a schematic three-dimensional view illustrating a three-dimensional memory device 20 according to some embodiments of the present disclosure. The three-dimensional memory device 20 is similar to the three-dimensional memory device 10 as described with reference to FIG. 9A-9C. Only differences therebween will be described, the same or the like parts would not be repeated again.

Referring to FIG. 15, in some embodiments, the three-dimensional memory device 20 further includes insulating walls 200. The insulating walls 200 penetrate through the stacking structures 112, and respectively extend between adjacent columns of the cell regions CR along a column direction of the cell regions CR (e.g., the direction Y). Each stacking structure 112 can be regarded as being cut into two half portions by one of the insulating walls 200. Each half of the stacking structure 112 include conductive layers 110 and insulating layers 104 alternately stacked on the substrate 100, and the two half portions of the stacking structure 112 are laterally spaced apart from each other by one of the insulating walls 200. Consequently, laterally adjacent memory cells MC at opposite sides of one of the insulating walls 200 include separate stacks of the conductive layers 110, and interference between the these memory cells MC may be further reduced. In some embodiments, a method for forming the insulating walls 200 includes forming trenches in the initial stacking structure 102 (as shown in FIG. 2A) by a lithography process and an etching process, and filling an insulating material into these trenches. Subsequently, portions of the insulating material above the initial stacking structure 102 may be removed by a planarization process (e.g., a polishing process, an etching process or a combination thereof), and remained portions of the insulating material form the insulating walls 200. In some embodiments, the step for forming the insulating walls 200 and the step for forming the isolation pillars 108 as described with reference to FIG. 3A and FIG. 3B are performed simultaneously. In alternative embodiments, the step for forming the insulating walls 200 may precede or follow the step for forming the isolation pillars 108.

As above, the three-dimensional memory device according to embodiments of the present disclosure includes stacking structures laterally spaced apart from one another, and includes isolation pillars extending between the stacking structures and defining cell regions between the stacking structures. Further, the three-dimensional memory device also includes gate dielectric layers and channel layers lining on inner sidewalls of the cell regions, and includes pairs of conductive pillars each separately located within one of the cell regions and laterally surrounded by the channel layer in the same cell region. Memory cells can be respectively defined by one of the conductive layers in the stacking structures and closest portions of the gate dielectric layer, the channel layer and the pair of conductive pillars in the cell region laterally adjacent to this conductive layer, and may be ferroelectric FETs or charge trap flash (CTF) transistors. Further, the isolation pillars further protrude into the stacking structures along a lateral direction, such that the conductive layers and insulating layers in the stacking structures can keep in physical contact with the isolation pillars even if the conductive layers are laterally recessed. Therefore, gaps are absent between the isolation pillars and the stacking structures, thus adjacent cell regions can be prevented from communicating with each other through these gaps. Consequently, the gate dielectric layers within adjacent cell regions can be prevented from being in contact with each other. Similarly, the channel layers within adjacent cell regions can be prevented from being in contact with each other as well. As a result, interference of adjacent memory cells separated by the isolation pillars extending in between can be effectively prevented.

In an aspect of the present disclosure, a three-dimensional memory device is provided. The three-dimensional memory device comprises: a first stacking structure and a second stacking structure, formed on a substrate and laterally spaced apart from each other along a first direction, wherein the first stacking structure comprises first insulating layers and first conductive layers alternately stacked on the substrate, and the second stacking structure comprises second insulating layers and second conductive layers alternately stacked on the substrate; isolation pillars, extending along a vertical direction on the substrate, and extending along the first direction between the first and second stacking structures, wherein the isolation pillars further protrude into the first and second stacking structures, and a space between the first and second stacking structures is divided into cell regions by the isolation pillars; gate dielectric layers, respectively formed in one of the cell regions, and covering opposing sidewalls of the first and second stacking structures as well as sidewalls of the isolation pillars; channel layers, respectively covering an inner surface of one of the gate dielectric layers; and conductive pillars, extending along the vertical direction on the substrate and located within the cell regions, wherein at least two of the conductive pillars are located in one of the cell regions and laterally surrounded by the channel layer in the one of the cell regions, and the conductive pillars in the one of the cell regions are laterally separated from one another.

In another aspect of the present disclosure, a three-dimensional memory device is provided. The three-dimensional memory device comprises: a first conductive layer and a second conductive layer, laterally extending over a substrate along a first direction, and are spaced apart from each other along a second direction intersected with the first direction; a first isolation pillar and a second isolation pillar, extending along a vertical direction on the substrate and extending along the second direction between the first and second conductive layers, wherein end portions of the first and second conductive layers are in contact with the first and second conductive layers, the first and second conductive layers are laterally recessed in corresponding to the end portions of the first and second isolation pillars, the first and second isolation pillars are laterally spaced apart from each other along the first direction, such that a cell region laterally surrounded by the first and second conductive layers as well as the first and second isolation pillars is defined, and a length of the first and second isolation pillars along the second direction is greater than a length of the cell region along the second direction; a gate dielectric layer, formed in the cell region and covering sidewalls of the first and second conductive layers as well as sidewalls of the first and second isolation pillars; a channel layer, formed in the cell region and covering an inner surface of the gate dielectric layer; and a first conductive pillar and a second conductive pillar, extending along the vertical direction on the substrate and laterally surrounded by the channel layer, wherein the first and second conductive pillars are laterally spaced apart from each other along the first direction, and are in contact with the channel layer.

In yet another aspect of the present disclosure, a manufacturing method of a three-dimensional memory device is provided. The method comprises: forming an initial stacking structure on a substrate, wherein the initial stacking structure comprises insulating layers and sacrificial layers alternately stacked on the substrate along a vertical direction; forming isolation pillars vertically penetrating through the initial stacking structure, wherein the isolation pillars are separately arranged along a first direction; forming a trench vertically penetrating through the initial stacking structure and laterally extending through the initial stacking structure along the first direction, wherein remained portions of the initial stacking structure are laterally spaced apart along a second direction intersected with the first direction and form a first stacking structure and a second stacking structure, the isolation pillars extend between the first and second stacking structures along the second direction, end portions of each isolation pillar are embedded in the first and second stacking structures, and cell regions are defined between the isolation pillars; replacing the sacrificial layers in the first and second stacking structures by conductive layers; conformally forming a gate dielectric layer and a channel layer in the trench; filling up the trench with an insulating material; and forming conductive pillars in the insulating material, wherein the conductive pillars vertically penetrate through the insulating material, and at least two of the conductive pillars are located within one of the cell regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional memory device, comprising:
  a first stacking structure and a second stacking structure, formed on a substrate and laterally spaced apart from each other along a lateral direction, wherein the first stacking structure comprises first insulating layers and first conductive layers alternately stacked on the substrate, and the second stacking structure comprises second insulating layers and second conductive layers alternately stacked on the substrate;
  isolation pillars, extending along a vertical direction on the substrate, and extending along the lateral direction between the first stacking structure and the second stacking structure, wherein the isolation pillars laterally protrude into the first conductive layers, the first insulating layers, the second conductive layers and the second insulating layers, and a space between the first stacking structure and the second stacking structure is divided into cell regions by the isolation pillars;
  gate dielectric layers, respectively formed in each of the cell regions, and covering opposing sidewalls of the first stacking structure and the second stacking structure as well as sidewalls of the isolation pillars;
  channel layers, respectively covering an inner surface of one of the gate dielectric layers; and
  conductive pillars, extending along the vertical direction on the substrate and located within the cell regions, wherein at least two of the conductive pillars are located in each of the cell regions and laterally surrounded by one of the channel layers, and the conductive pillars in each of the cell regions are laterally separated from one another.

2. The three-dimensional memory device according to claim 1, wherein a length of each isolation pillar along the lateral direction is greater than a distance by which the first stacking structure is spaced apart from the second stacking structure along the lateral direction.

3. The three-dimensional memory device according to claim 1, wherein sidewalls of the first conductive layers in contact with the gate dielectric layers are laterally recessed from sidewalls of the first insulating layers in contact with the gate dielectric layers, and sidewalls of the second conductive layers in contact with the gate dielectric layers are laterally recessed from sidewalls of the second insulating layers in contact with the gate dielectric layers.

4. The three-dimensional memory device according to claim 1, wherein the first conductive layers, the first insulating layers, the second conductive layers and the second insulating layers are laterally recessed in corresponding to end portions of the isolation pillars embedded in the first stacking structure and the second stacking structure.

5. The three-dimensional memory device according to claim 1, wherein a bottom portion of the one of the gate dielectric layers in one of the cell regions laterally spans on the substrate and between laterally spaced apart portions of the one of the channel layer in the one of the cell regions.

6. The three-dimensional memory device according to claim 5, wherein the conductive pillars in the one of the cell regions extends along the vertical direction from the bottom portion of the one of the gate dielectric layers.

7. The three-dimensional memory device according to claim 1, wherein the gate dielectric layers are formed of a ferroelectric material.

8. The three-dimensional memory device according to claim 1, wherein the gate dielectric layers are charge trap layers.

9. The three-dimensional memory device according to claim 1, further comprising insulating structures, respectively located between the at least two of the conductive pillars within each of the cell regions.

10. The three-dimensional memory device according to claim 1, wherein the isolation pillars have an etching selectivity with respect to the first insulating layers and the second insulating layers.

11. The three-dimensional memory device according to claim 1, wherein the substrate is an etching stop layer formed over a semiconductor substrate, and the etching stop layer has an etching selectivity with respect to the first insulating layers and the second insulating layers.

12. A three-dimensional memory device, comprising:
a first conductive layer and a second conductive layer, laterally extending over a substrate along a first direction, and are spaced apart from each other along a second direction intersected with the first direction;
a first isolation pillar and a second isolation pillar, extending along a vertical direction on the substrate and extending along the second direction between the first conductive layer and the second conductive layer, wherein end portions of the first isolation pillar and the second isolation pillar are in contact with the first conductive layer and the second conductive layer, the first conductive layer and the second conductive layer are laterally recessed in corresponding to the end portions of the first isolation pillar and the second isolation pillar, the first isolation pillar and the second isolation pillar are laterally spaced apart from each other along the first direction, such that a cell region laterally surrounded by the first conductive layer and the second conductive layer as well as the first isolation pillar and the second isolation pillar is defined, and a length of the first isolation pillar and the second isolation pillar along the second direction is greater than a length of the cell region along the second direction;
a gate dielectric layer, formed in the cell region and covering sidewalls of the first conductive layer and the second conductive layer as well as sidewalls of the first isolation pillar and the second isolation pillar;
a channel layer, formed in the cell region and covering an inner surface of the gate dielectric layer; and
a first conductive pillar and a second conductive pillar, extending along the vertical direction on the substrate and laterally surrounded by the channel layer, wherein the first conductive pillar and the second conductive pillar are laterally spaced apart from each other along the first direction, and are in contact with the channel layer.

13. The three-dimensional memory device according to claim 12, wherein the end portions of the first isolation pillar and the second isolation pillar laterally protrude with respect to an outer sidewall of the gate dielectric layer.

14. The three-dimensional memory device according to claim 12, wherein the gate dielectric layer and the channel layer are respectively formed in an annulus shape.

15. The three-dimensional memory device according to claim 12, further comprising an insulating structure, extending along the vertical direction on the substrate and located between the first conductive pillar and the second conductive pillar.

16. A three-dimensional memory device, comprising:
a first stacking structure and a second stacking structure, extending along a first lateral direction and spaced apart from each other along a second lateral direction, and each comprising alternately stacked insulating layers and conductive layers;
isolation pillars, extending between and laterally protruding into the conductive layers and the insulating layers of the first stacking structure and the second stacking structure, wherein cell regions are each defined between adjacent ones of the isolation pillars;
ferroelectric layers, covering sidewalls of the isolation pillars, the first stacking structure and the second stacking structure, and respectively formed in the cell regions, respectively;
channel layers each separated from the isolation pillars, the first stacking structure and the second stacking structure via one of the ferroelectric layers;
pairs of conductive pillars, laterally surrounded by the channel layers, wherein the conductive pillars of each pair are located in one of the cell regions, and are laterally separated from each other; and
bit lines and source lines, running over the first stacking structure and the second stacking structure, wherein the conductive pillars of each pair are connected to one of the bit lines and one of the source lines, respectively.

17. The three-dimensional memory device according to claim 16, wherein the isolation pillars has a height identical with a height of the first stacking structure and the second stacking structure.

18. The three-dimensional memory device according to claim 16, wherein a length of the isolation pillars along the second lateral direction is greater than a width of the cell regions along the second lateral direction.

19. The three-dimensional memory device according to claim 16, further comprising:

an additional stacking structure, extending along the first lateral direction, and comprising alternately stacked additional conductive layers and additional insulating layers, wherein the second stacking structure extends between the first stacking structure and the additional stacking structure; and additional isolation pillars, separately extending between and laterally protruding into the second stacking structure and the additional stacking structure.

20. The three-dimensional memory device according to claim 19, wherein the conductive layers and the insulating layers in the second stacking structure continuously span from a first side of the second stacking structure in lateral contact with the isolation pillars, to a second side of the second stacking structure in lateral contact with the additional isolation pillars.

\* \* \* \* \*